US012628454B2

(12) United States Patent　　　(10) Patent No.:　US 12,628,454 B2
Park　　　　　　　　　　　　　　(45) Date of Patent:　May 12, 2026

(54) IMAGE SENSOR

(71) Applicant: SAMSUNG ELECTRONICS CO., LTD., Suwon-si (KR)

(72) Inventor: Miseon Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 542 days.

(21) Appl. No.: 18/082,252

(22) Filed: Dec. 15, 2022

(65) Prior Publication Data

US 2023/0246052 A1　　Aug. 3, 2023

(30) Foreign Application Priority Data

Jan. 28, 2022　(KR) ........................ 10-2022-0013202

(51) Int. Cl.
　　*H10F 39/00*　　　(2025.01)
　　*H10F 39/18*　　　(2025.01)
(52) U.S. Cl.
　　CPC ......... *H10F 39/807* (2025.01); *H10F 39/011* (2025.01); *H10F 39/182* (2025.01); *H10F 39/8053* (2025.01); *H10F 39/8057* (2025.01); *H10F 39/8063* (2025.01); *H10F 39/811* (2025.01)
(58) Field of Classification Search
　　CPC .... H10F 39/807; H10F 39/011; H10F 39/182; H10F 39/8053; H10F 39/8057; H10F 39/8063; H10F 39/811; H10F 39/024; H10F 39/18; H10F 39/199; H10F 39/8067; H10F 39/8023; H10F 39/806; H10F 39/802; H10F 39/8037
See application file for complete search history.

(56) References Cited

U.S. PATENT DOCUMENTS

| 9,160,953 | B2 | 10/2015 | Oishi | |
| 9,240,345 | B2 | 1/2016 | Sung | |
| 9,564,463 | B2 | 2/2017 | Ihara | |
| 10,504,953 | B2 | 12/2019 | Yanagita et al. | |
| 10,797,095 | B2 | 10/2020 | Lee et al. | |
| 10,979,621 | B2 | 4/2021 | Kim et al. | |
| 2016/0172391 | A1* | 6/2016 | Ihara | H10F 39/014 |
| | | | | 438/70 |
| 2017/0133414 | A1* | 5/2017 | Chiang | H10F 39/199 |
| 2021/0104560 | A1 | 4/2021 | Lee | |
| 2021/0375973 | A1* | 12/2021 | Ha | H10F 39/8023 |
| 2022/0020803 | A1* | 1/2022 | Kim | H01L 23/481 |
| 2023/0197753 | A1* | 6/2023 | Iwabuchi | H10F 39/8037 |

* cited by examiner

*Primary Examiner* — Sue A Purvis
*Assistant Examiner* — Carnell Hunter, III
(74) *Attorney, Agent, or Firm* — Sughrue Mion, PLLC

(57)　　　　　　ABSTRACT

An image sensor includes a pixel division structure, a light sensing element, a planarization layer, a color filter array layer, and a microlens. The pixel division structure extends through a substrate in a vertical direction, and defines unit pixel regions where unit pixels are formed. The light sensing element is in each unit pixel region. The planarization layer is on the substrate. The color filter array layer including color filters is on the planarization layer. The microlens is on the color filter array layer. The pixel division structure includes a core extending in the vertical direction and a lateral pattern structure on a sidewall thereof. The lateral pattern structure includes a first lateral pattern on a sidewall of a lower portion of the core, an air spacer on the first lateral pattern, and a second lateral pattern on outer sidewalls of the first lateral pattern and the air spacer.

21 Claims, 24 Drawing Sheets

| IV | III | II | I | II | III | IV |

IMAGE SENSOR

CROSS-REFERENCE TO RELATED APPLICATION

This application is based on and claims priority from Korean Patent Application No. 10-2022-0013202, filed on Jan. 28, 2022 in the Korean Intellectual Property Office (KIPO), the disclosure of which is incorporated herein in its entirety by reference.

BACKGROUND

1. Field

Example embodiments relate to an image sensor. More particularly, example embodiments relate to an image sensor including a pixel division structure.

2. Description of Related Art

In an image sensor including a pixel division structure, electrons may flow at a boundary between the pixel division structure and a light sensing element to generate dark current. A negative bias may be applied to a core included in the pixel division structure, so that the flow of electrons may be captured by an impurity region to decrease the dark current. The core included in the pixel division structure may include polysilicon; however, polysilicon may have a high light absorption rate so that the efficiency of light in the image sensor may decrease.

SUMMARY

Example embodiments provide an image sensor having improved characteristics.

In accordance with an aspect of the disclosure, an image sensor includes a pixel division structure extending through a substrate in a vertical direction, the vertical direction being substantially perpendicular to an upper surface of the substrate, the pixel division structure defining unit pixel regions in which unit pixels are respectively formed; a light sensing element in each of the unit pixel regions; a planarization layer on the substrate; a color filter array layer on the planarization layer, the color filter array layer including color filters; and a microlens on the color filter array layer, wherein the pixel division structure includes a core extending in the vertical direction; and a lateral pattern structure on a sidewall of the core, and wherein the lateral pattern structure includes a first lateral pattern on a sidewall of a lower portion of the core; an air spacer on the first lateral pattern; and a second lateral pattern on outer sidewalls of the first lateral pattern and on outer sidewalls of the air spacer.

In accordance with an aspect of the disclosure, an image sensor includes a pixel division structure extending through a substrate in a vertical direction, the vertical direction being substantially perpendicular to an upper surface of the substrate, the pixel division structure defining unit pixel regions in which unit pixels are respectively formed; a light sensing element in each of the unit pixel regions; a planarization layer on the substrate; a color filter array layer on the planarization layer, the color filter array layer includes color filters; and a microlens on the color filter array layer, wherein the pixel division structure includes a core extending in the vertical direction and including polysilicon; and a lateral pattern structure on a sidewall of the core, and wherein the lateral pattern structure includes an air spacer on the sidewall of the core; and a first lateral pattern on an outer sidewall of the air spacer, the first lateral pattern including an oxide.

In accordance with an aspect of the disclosure, an image sensor includes a first substrate defining a first region, a second region, a third region, and a fourth region at an inside of the first substrate and a space under and over the first substrate, the second region surrounding the first region, the third region surrounding the second region, and the fourth region surrounding the third region; a first insulating interlayer on the first substrate, the first insulating interlayer containing first wirings in the third region; a second insulating interlayer on the first insulating interlayer, the second insulating interlayer containing second wirings in the third region; a second substrate on the second insulating interlayer; a pixel division structure in the second substrate in the first region and the second region, the pixel division structure defining unit pixel regions in which unit pixels are formed, respectively; a light sensing element in each of the unit pixel regions of the second substrate; a transfer gate (TG) extending through a lower portion of the second substrate, the TG contacting the light sensing element; a floating diffusion (FD) region at the lower portion of the second substrate adjacent to the TG; a lower planarization layer on the second substrate; a color filter array layer on the lower planarization layer, the color filter array layer including color filters; an interference blocking structure between adjacent ones of the color filters; and a microlens on the color filter array layer, wherein the pixel division structure includes a core extending in a vertical direction, the vertical direction being substantially perpendicular to an upper surface of the first substrate; and a lateral pattern structure on a sidewall of the core, and wherein the lateral pattern structure includes a first lateral pattern on a sidewall of a lower portion of the core; an air spacer on the first lateral pattern; and a second lateral pattern on outer sidewalls of the first lateral pattern and outer sidewalls of the air spacer.

The pixel division structure of the image sensor in accordance with example embodiments may include the core including polysilicon and the lateral pattern structure, and the lateral pattern structure may include the lateral pattern including a nitride having a high refractive index and the air spacer including air having a low refractive index. Thus, the pixel in the image sensor may have enhanced light efficiency.

BRIEF DESCRIPTION OF DRAWINGS

FIG. 15 is a cross-sectional view illustrating an image sensor according to an embodiment.

FIG. 24 is a diagram showing a cross-sectional view of a configuration of regions according to an embodiment.

DESCRIPTION OF EMBODIMENTS

Figure 1:
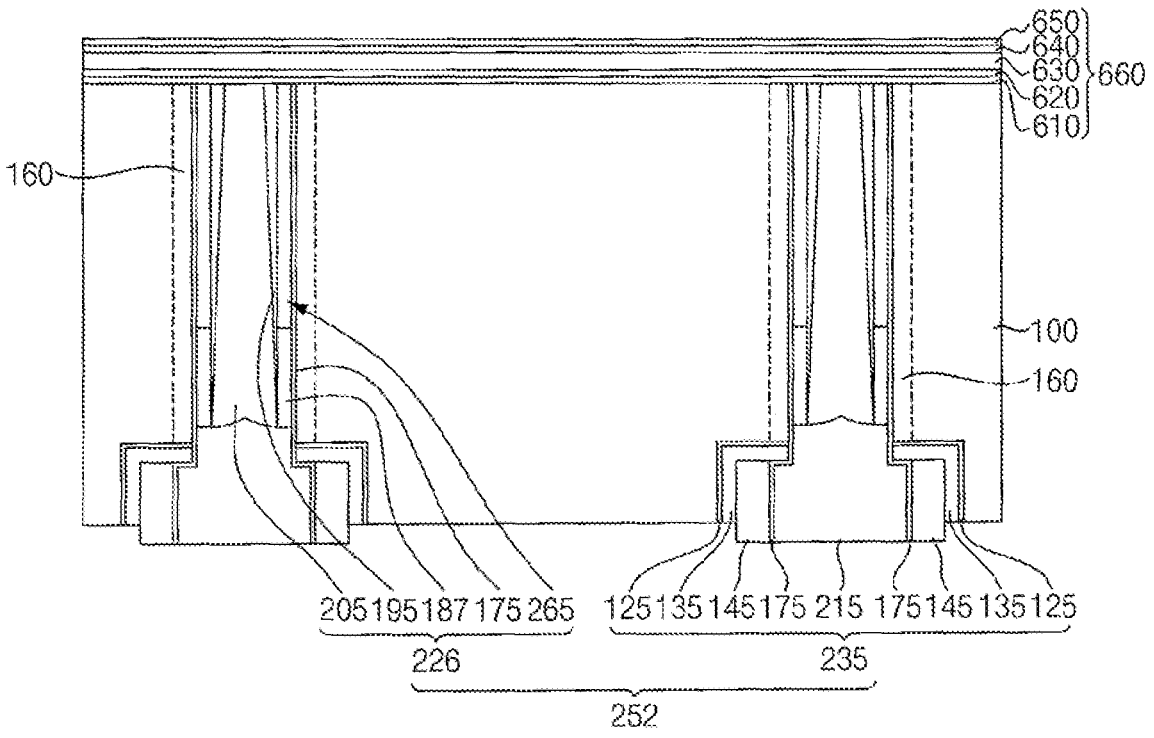
FIG. 1 is a cross-sectional view illustrating a pixel division structure included in an image sensor according to an embodiment.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

Pixel division structures, image sensors including the pixel division structures and methods of manufacturing the image sensors in accordance with example embodiments will be more clearly understood from the following detailed description taken in conjunction with the accompanying drawings.

It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

First to fourth regions I, II, III and IV may refer to only an inside of a reference substrate, a first substrate and/or a second substrate. Alternatively, the first to fourth regions I, II, III and IV may also refer to spaces over and under the reference substrate, the first substrate and/or the second substrate.

A direction substantially parallel to the reference substrate or the first substrate and/or the second substrate may be referred to as a horizontal direction, and a direction substantially perpendicular to the surface of the reference substrate or the first substrate and/or the second substrate may be referred to as a vertical direction. In the specifications, up vs. down, on and over vs. beneath and under, upper surface vs. lower surface, and upper portion vs. lower portion are relative conceptions so as to describe opposite sides in the vertical direction, and each wording may have opposite meanings according to the specific parts to be explained in the specifications.

FIG. 1 is a cross-sectional view illustrating a pixel division structure included in an image sensor in accordance with example embodiments.

Referring to FIG. 1, a pixel division structure 252 may extend through a substrate 100 in the vertical direction, and may have a lattice shape in a plan view.

In example embodiments, the substrate 100 may include silicon, germanium, silicon-germanium, or a III-V group compound semiconductor, such as GaP, GaAs, or GaSb. In example embodiments, a p-type well doped with p-type impurities may be formed partially or entirely in the substrate 100.

Unit pixel regions in which unit pixels are formed, respectively, may be defined by the pixel division structure 252 in the substrate 100. In example embodiments, the unit pixels may be arranged in the horizontal direction to form a pixel array.

In example embodiments, the pixel division structure 252 may include a first filling pattern structure 235 and a second filling pattern structure 226 stacked in the vertical direction. The second filling pattern structure 226 may include a core extending in the vertical direction and a first lateral pattern structure covering a sidewall of the core.

In example embodiments, the core may include second and third filling patterns 195 and 205, and the first lateral pattern structure may include an upper portion of the first lateral pattern 175, a second lateral pattern 187 and an air spacer 265. The second lateral pattern 187 and the air spacer 265 may be sequentially stacked in the vertical direction.

In example embodiments, the second filling pattern 195 may include p-type impurities, e.g., boron or n-type impurities, e.g., phosphorus at a first impurity concentration. The third filling pattern 205 may include undoped polysilicon or polysilicon doped with impurities the same as or substantially the same as the impurities doped in the second filling pattern 195.

In example embodiments, the third filling pattern 205 may have a width gradually increasing in the vertical direction from a top toward a bottom thereof as shown, e.g., in FIG. 1. In example embodiments, a portion of the second filling pattern 195 adjacent to the third filling pattern 205 may have a thickness gradually decreasing in the vertical direction from a top toward a bottom thereof.

In example embodiments, a lower surface of the core including the second and third filling patterns 195 and 205 may have a concave shape downwardly. For example, a center portion of the lower surface of the second and third filling patterns 195 and 205 may protrude in an upward direction.

The second lateral pattern 187 and the air spacer 265 may cover the sidewall of the core, and a lower portion of the first lateral pattern 175 may cover outer sidewalls of the second lateral pattern 187 and the air spacer 265. The first lateral pattern 175 may include an oxide, e.g., silicon oxide, the second lateral pattern 187 may include a nitride, e.g., silicon nitride, and the air spacer 265 may include air.

The first filling pattern structure 235 may include a fourth filling pattern 215 under the core and the second lateral pattern 187, a lower portion of the first lateral pattern 175 on a sidewall of the fourth filling pattern 215, a first filling pattern 145 covering an outer sidewall of the lower portion of the first lateral pattern 175, and first and second pads 125 and 135 covering an outer sidewall and an upper surface of the first filling pattern 145.

In example embodiments, the fourth filling pattern 215 may have an upper portion having a relatively small width and a lower portion having a relatively large width. The fourth filling pattern 215 may include an oxide, e.g., silicon oxide.

The upper portion of the first lateral pattern 175 may be included in the second filling pattern structure 226, and the lower portion of the first lateral pattern 175 may be included in the first filling pattern structure 235. The lower and upper portions of the first lateral pattern 175 may be connected to each other and integrally formed. The lower portion of the first lateral pattern 175 may cover a sidewall of an upper portion of the fourth filling pattern 215 and an upper surface and a sidewall of a lower portion of the fourth filling pattern 215.

The first filling pattern 145 may cover an outer sidewall of a portion of the first lateral pattern 175 on the sidewall of the lower portion of the fourth filling pattern 215. The first filling pattern 145 may include an oxide, e.g., silicon oxide.

The second pad 135 may cover the outer sidewall and the upper surface of the first filling pattern 145. The second pad 135 may not cover a sidewall of the lower portion of the first filling pattern 145. The first pad 125 may cover an outer sidewall and an upper surface of the second pad 135. The first pad 125 may include an oxide, e.g., silicon oxide, and the second pad 135 may include a nitride, e.g., silicon nitride.

In example embodiments, a width of the first filling pattern structure 235 may be greater than a width of the second filling pattern structure 226.

An impurity region 160 may be formed at a portion of the substrate 100 adjacent to the pixel division structure 252, and may include p-type impurities, e.g., boron.

In the image sensor including the pixel division structure 252, electrons may flow at a boundary between the pixel division structure 252 and a light sensing element to generate dark current, and a negative bias may be applied to the core included in the pixel division structure 252 so that the flow of electrons may be captured by the impurity region 160 to decrease the dark current.

The core of the pixel division structure 252 may include undoped or doped polysilicon, and the first lateral pattern structure surrounding the core may include the second lateral pattern 187 including a nitride having a high dielectric constant so as to capture the electrons.

However, polysilicon included in the core may have a high light absorption rate so that the light efficiency of the pixel may decrease. Additionally, a nitride included in the second lateral pattern 187 may have a high refractive index and a high reflectivity, so that the light efficiency of the pixel may further decrease.

However, in example embodiments, the first lateral pattern structure surrounding the core may include the air spacer 265 having a low refractive index on the second lateral pattern 187 including a nitride having a high refractive index. Thus, the reflectivity of the pixel may decrease due to the presence of the air spacer 265, so that the light efficiency of the pixel may be enhanced.

That is, the first lateral pattern structure may include the second lateral pattern 187 having a high dielectric constant so as to decrease the dark current, and may also include the air spacer 265 having a low refractive index so as to increase the light efficiency. Accordingly, the image sensor including the first lateral pattern structure may have desired characteristics.

FIGS. 2 to 11 are cross-sectional views illustrating a method of forming a pixel division structure in accordance with example embodiments.

Figure 2:
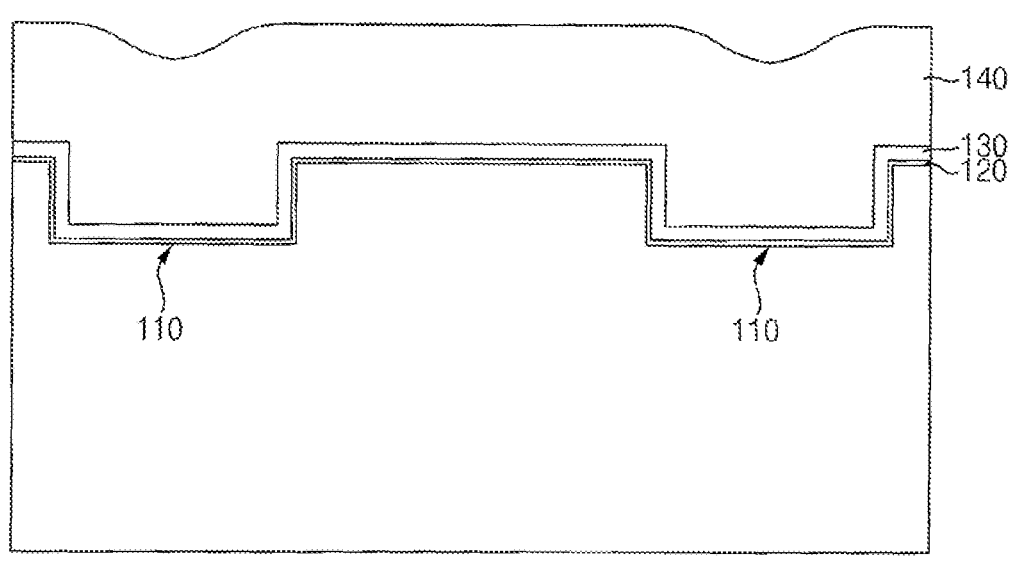
FIGS. 2 to 11 are cross-sectional views illustrating a method of forming a pixel division structure according to an embodiment.

Referring to FIG. 2, an upper portion of a substrate 100 may be removed to form a first trench 110, and a first pad layer 120, a second pad layer 130 and a first filling layer 140 may be sequentially stacked on the substrate 100 having the first trench 110 thereon.

In example embodiments, the first trench 110 may have a lattice pattern in a plan view.

Figure 3:
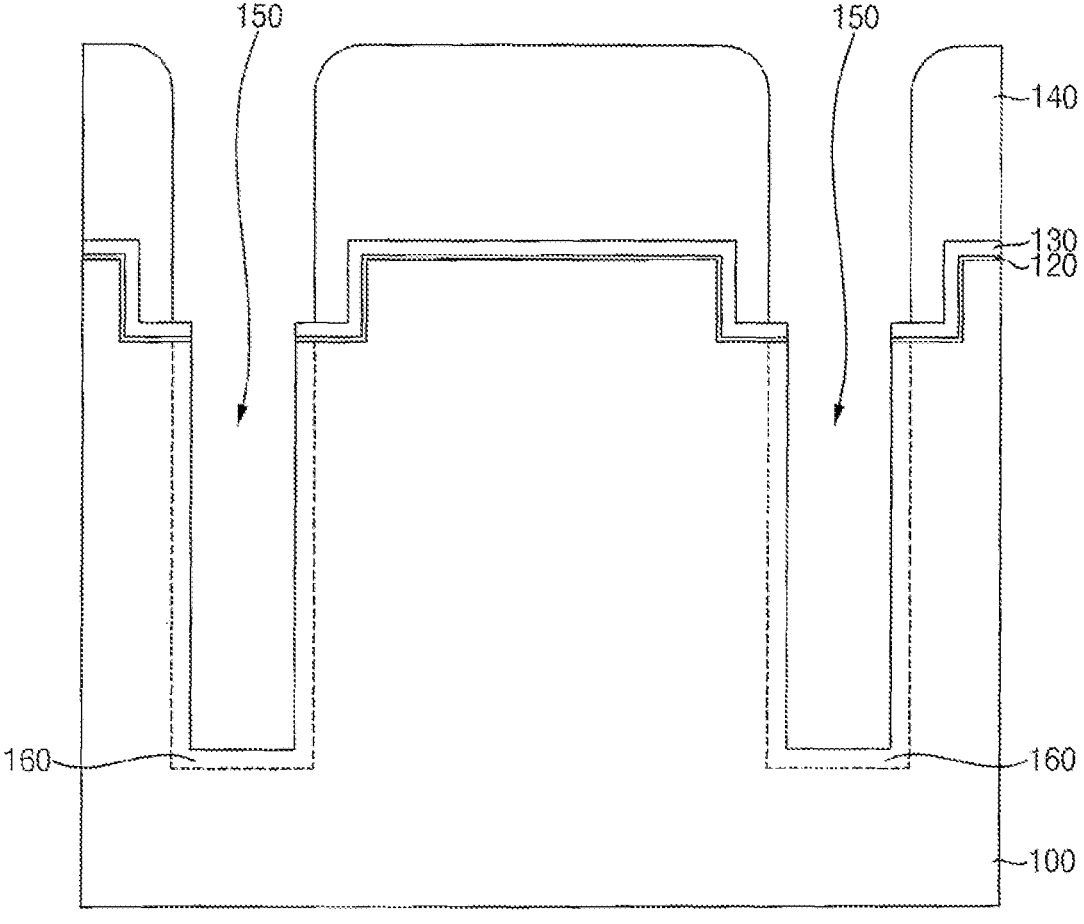

Referring to FIG. 3, the first filling layer 140, the second pad layer 130, the first pad layer 120 and the substrate 100 may be sequentially removed by an etching process to form a second trench 150.

The etching process may be, e.g., a dry etching process, and thus may be performed with an etching mask on the first filling layer 140. Due to the difference between etching rates of the first filling layer 140 and the second pad layer 130, each of the second trenches 150 may be formed to have a width in the first and second pad layers 120 and 130 less than a width in the first filling layer 140.

Hereinafter, in the second trench 150, a portion extending through a portion of the substrate 100 and the first and second pad layers 120 and 130 may be referred to as a lower portion, and a portion extending through the first filling layer 140 may be referred to as an upper portion.

P-type impurities, e.g., boron may be doped into a portion of the substrate 100 adjacent to the second trench 150 by an ion implantation process to form an impurity region 160.

Figure 4:
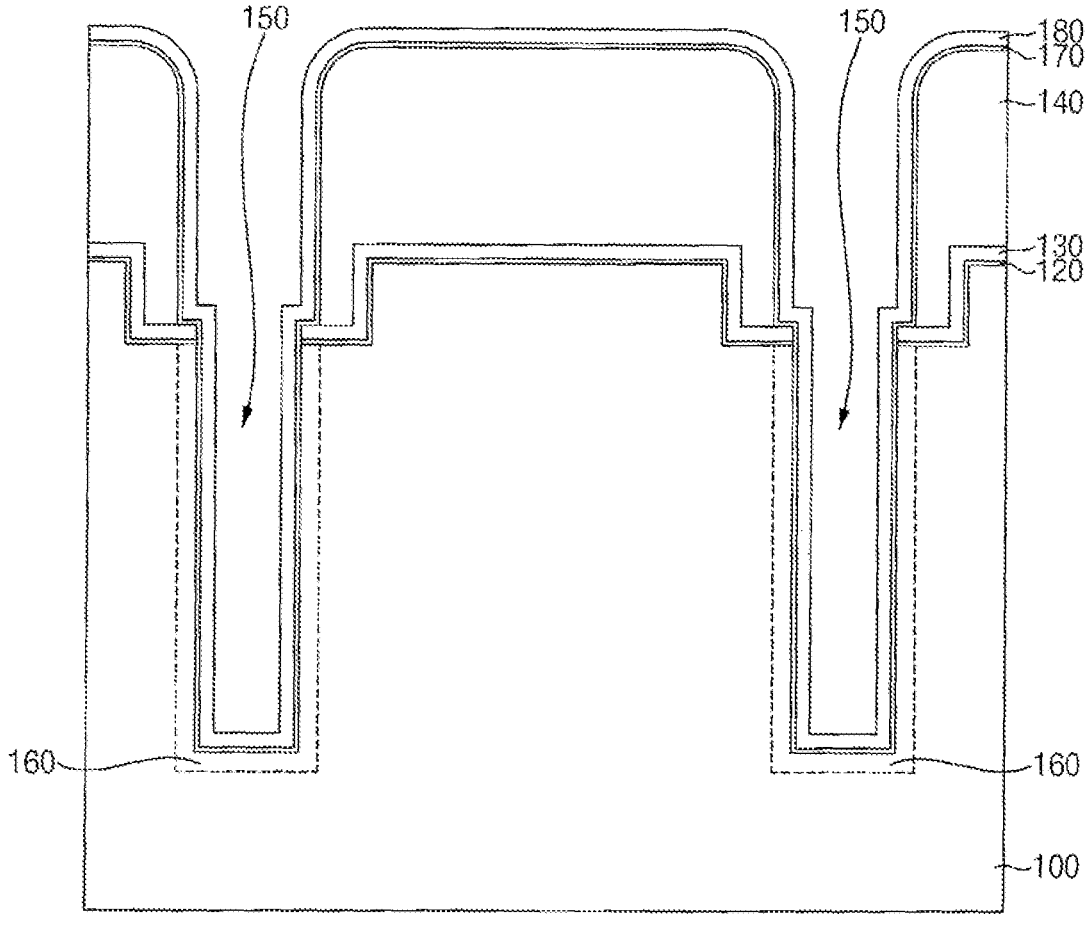

Referring to FIG. 4, a lateral layer structure may be formed on an inner wall of the second trench 150 and an upper surface of the first filling layer 140.

In example embodiments, the lateral layer structure may include first and second lateral layers 170 and 180 sequentially stacked and including different materials. The first lateral layer 170 may include an oxide, e.g., silicon oxide, and the second lateral layer 180 may include a nitride, e.g., silicon nitride, silicon carbonitride, silicon oxycarbonitride, etc.

Figure 5:
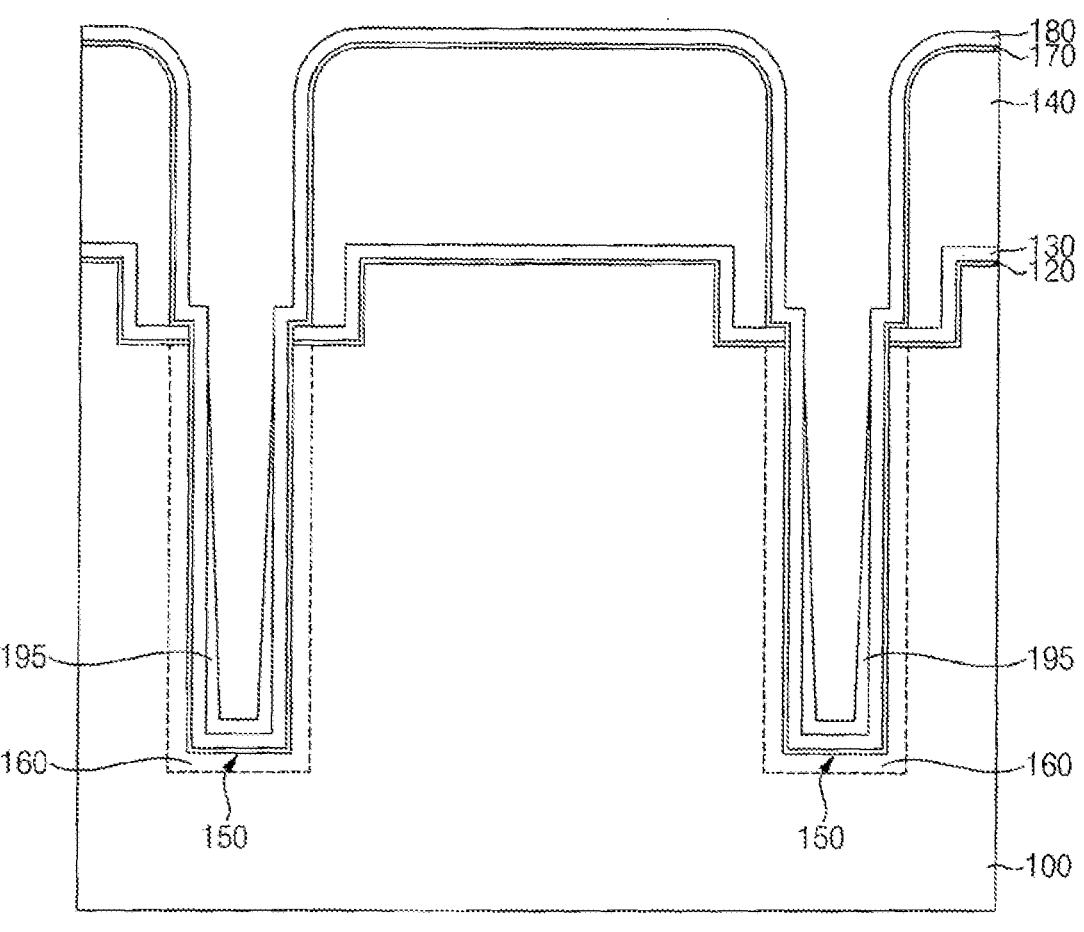

Referring to FIG. 5, a second filling layer may be formed on the lateral layer structure, and the second filling layer may not entirely fill a remaining portion of the second trench 150 but may be formed on a sidewall and a bottom of the second trench 150.

In example embodiments, the second filling layer may include polysilicon doped with p-type impurities, e.g., boron or n-type impurities, e.g., phosphorus, and thus may include a conductive material.

In an example embodiment the second filling layer may be formed by a low pressure chemical vapor deposition (LPCVD) process or a plasma enhanced chemical vapor deposition (PECVD) process using a silicon source gas, e.g., silane ($SiH_4$) gas and a boron source gas, e.g., diborane ($B_2H_6$) gas or a phosphorus source gas, e.g., phosphine ($PH_3$) gas.

Alternatively, the second filling layer may be formed to include undoped polysilicon, and boron or phosphorus may be doped into the second filling layer by, e.g., an ion implantation process, a plasma doping process, a gas phase doping process, etc., so that the second filling layer may include polysilicon doped with boron or phosphorus.

An etching process may be performed on the second filling layer so that a portion of the second filling layer at an upper portion of the second trench 150 may be removed to form a second filling pattern 195.

In example embodiments, the etching process may be performed using an etching gas including chlorine (Cl$_2$) gas, and may be an anisotropic etching process. Thus, the portion of the second filling layer at the upper portion of the second trench 150 may be entirely removed, and the portion of the second filling layer at the lower portion of the second trench 150 may remain as the second filling pattern 195 having a tapered shape in which a width gradually increases from a top toward a bottom thereof. Thus, a remaining portion of the lower portion of the second trench 150 partially filled with the second filling pattern 195 may have a width gradually decreasing from a top toward a bottom thereof.

In example embodiments, the deposition process for forming the second filling layer and the etching process of the second filling layer may be performed in-situ in the same chamber, or ex-situ in different chambers.

In an example embodiment, an uppermost surface of the second filling pattern 195 remaining in the second trench 150 may be lower than a lower surface of the first pad layer 120, however, the disclosure may not be limited thereto. That is, the uppermost surface of the second filling pattern 195 in the second trench 150 may be lower than, or coplanar with or substantially coplanar with a bottom of the upper portion of the second trench 150, that is, an upper surface of the second pad layer 130 in the first trench 110.

Figure 6:
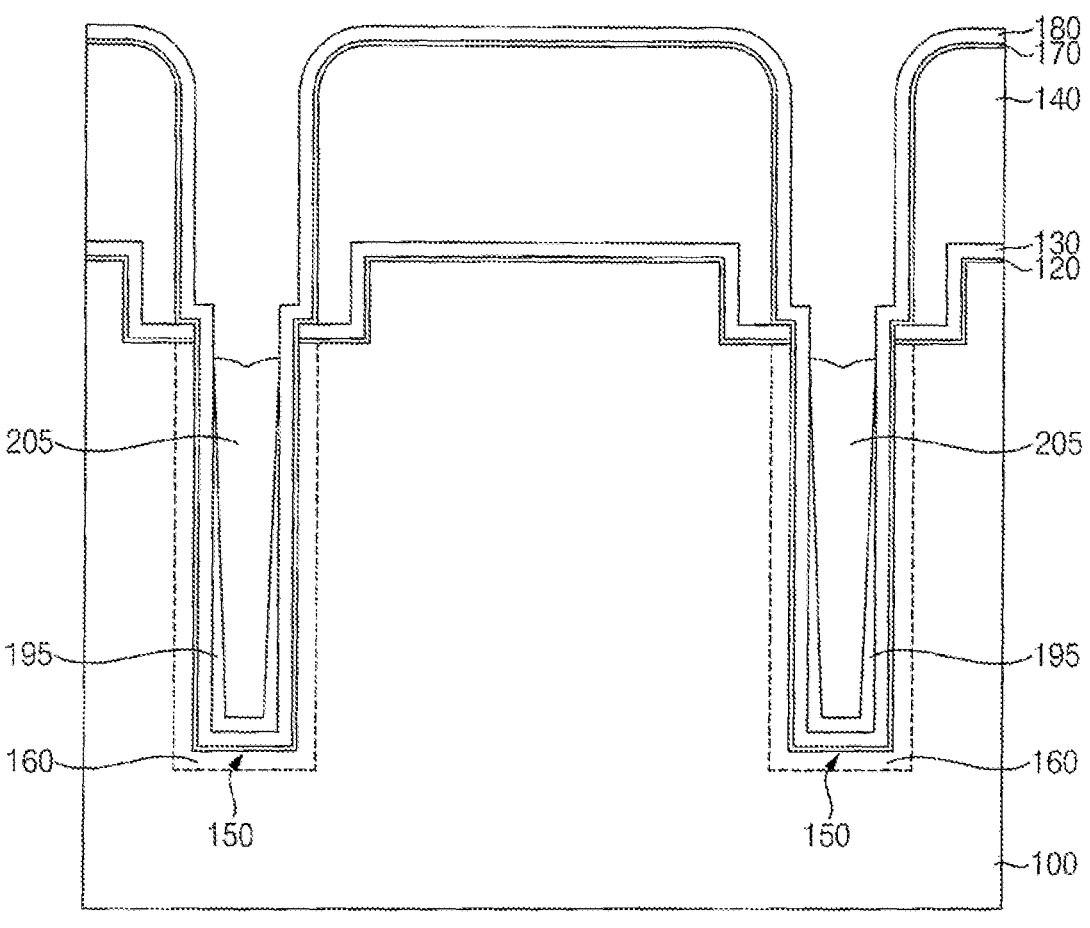

Referring to FIG. 6, a third filling layer may be formed on the second filling pattern 195 to fill the second trench 150, and may be etched until an upper surface of the portion of the second filling pattern 195 in the second trench 150 is exposed.

Thus, a third filling pattern 205 may be formed on the second filling pattern 195 at a lower portion of the second trench 150. The third filling pattern 205 may have a concave upper surface. In an example embodiment, a cross-section of the third filling pattern 205 in the vertical direction may have a V-shape (see, e.g., FIG. 6).

The third filling layer may be formed by a deposition process, e.g., an LPCVD process, a PECVD process, etc. As illustrated above, the remaining portion of the lower portion of the second trench 150 may have the width gradually decreasing from a top toward a bottom thereof, and thus no void or seam may be formed when the third filling layer is deposited at the lower portion of the second trench 150.

In example embodiments, the third filling pattern 205 may include undoped or doped polysilicon.

The second and third filling patterns 195 and 205 at the lower portion of the second trench 150 may form a core.

Figure 7:
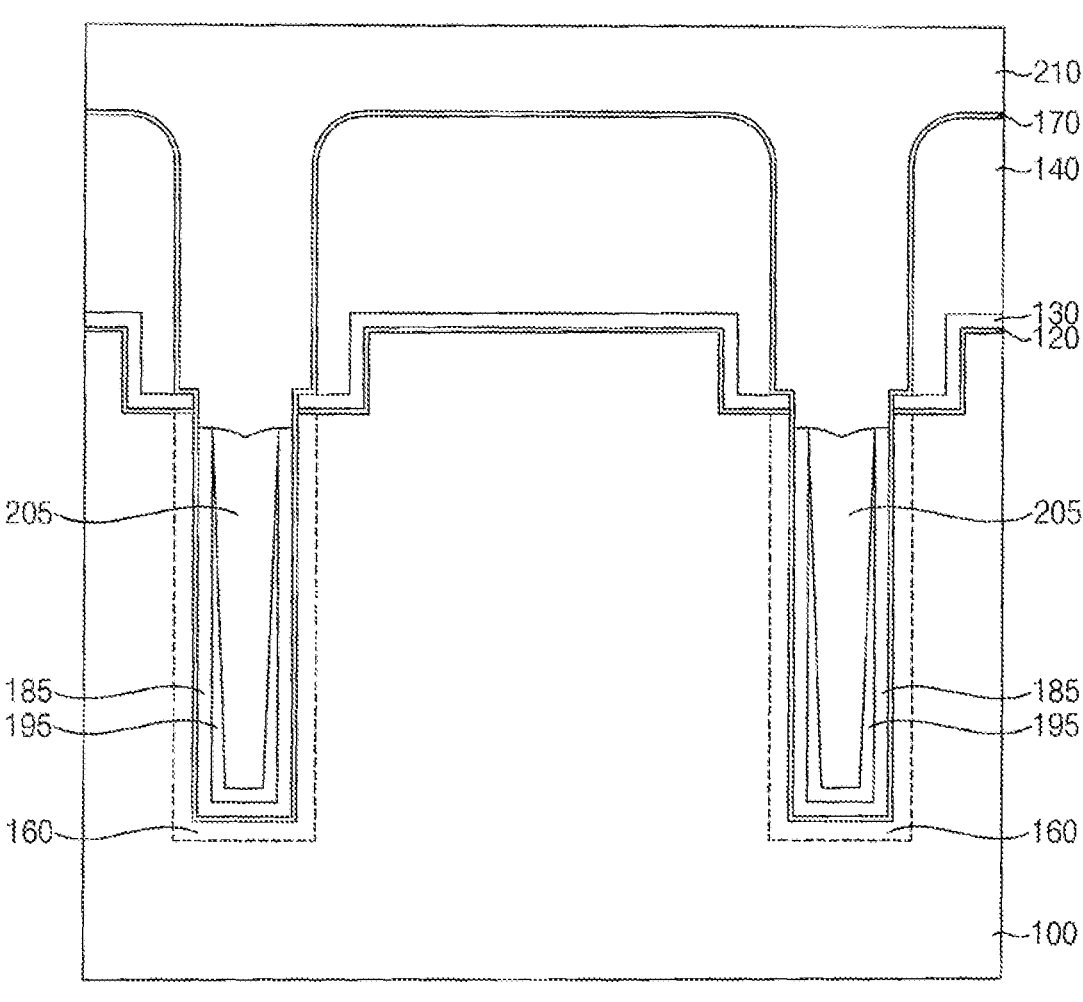

Referring to FIG. 7, a portion of the second lateral layer 180 at a height higher than an upper surface of the core, that is, an upper portion of the second lateral layer 180 may be removed so that a preliminary second lateral pattern 185 may remain at the lower portion of the second trench 150.

In example embodiments, the upper portion of the second lateral layer 180 may be removed by a wet etching process. As the upper portion of the second lateral layer 180 is removed, a surface of an upper portion of the first lateral layer 170 may be exposed.

A fourth filling layer 210 may be formed on surfaces of the core, the preliminary second lateral pattern 185 and the upper portion of the first lateral layer 170 to fill the second trench 150.

The fourth filling layer 210 may include an oxide, e.g., silicon oxide.

A thermal treatment process may be performed on the substrate 100 having the above structures thereon.

Figure 8:
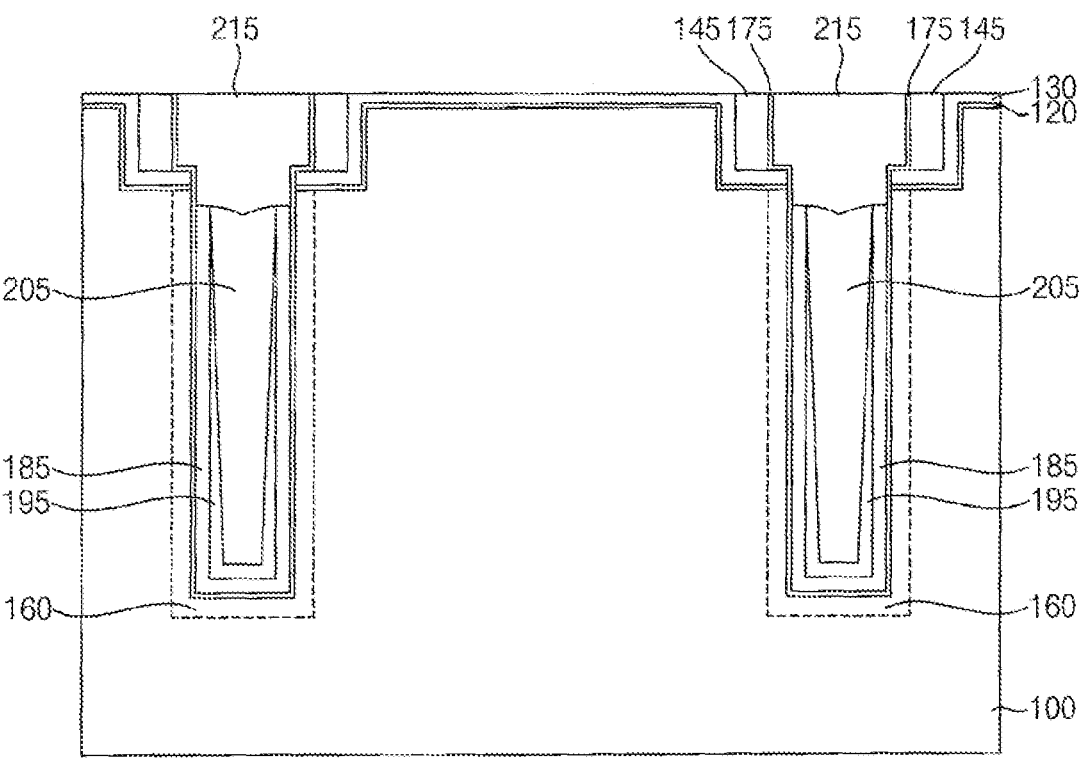

Referring to FIG. 8, the fourth filling layer 210, the first lateral layer 170 and the first filling layer 140 may be planarized until an upper surface of the second pad layer 130 is exposed.

In example embodiments, the planarization process may include a chemical mechanical polishing (CMP) process and/or an etch back process.

By the planarization process, the fourth filling layer 210 may be transformed into a fourth filling pattern 215, the first lateral layer 170 may be transformed into a first lateral pattern 175, and the first filling layer 140 may be transformed into a first filling pattern 145. The first lateral pattern 175 and the preliminary second lateral pattern 185 may form a preliminary lateral pattern structure.

Figure 9:
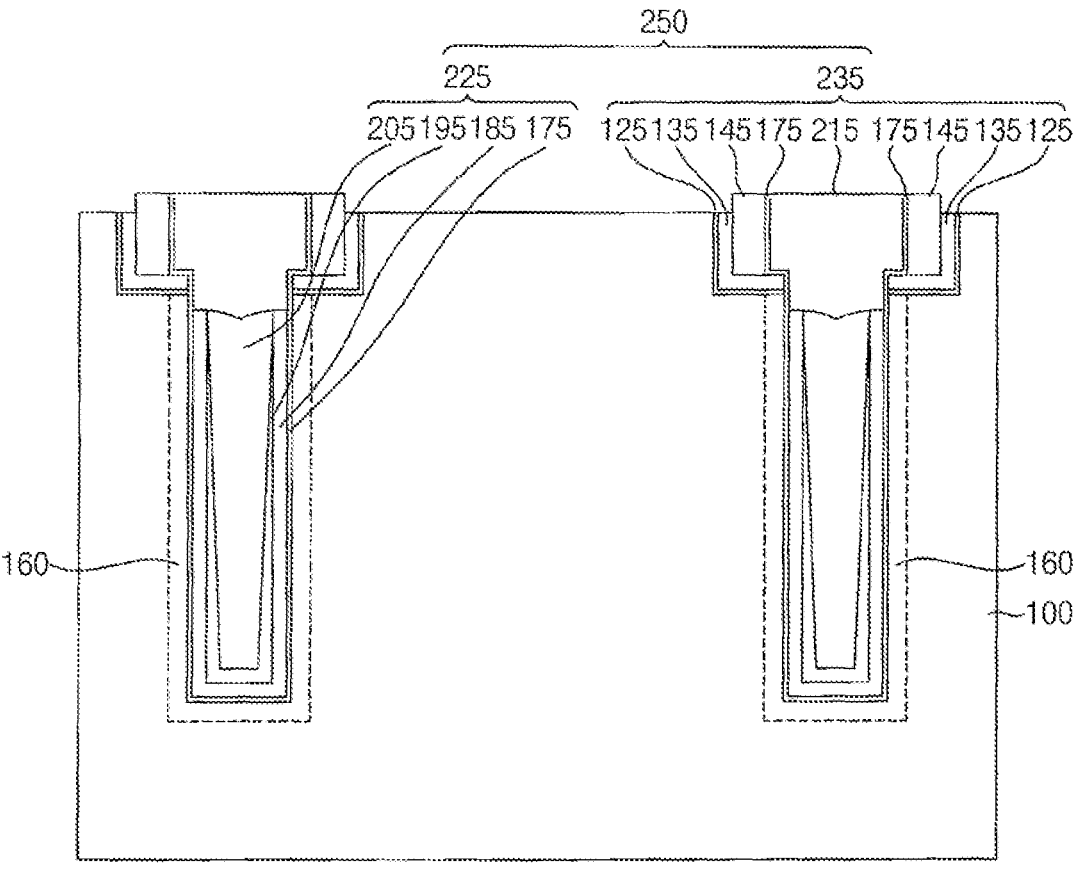

Referring to FIG. 9, the second pad layer 130 may be partially removed to form a second pad 135, and thus an upper surface of the first pad layer 120 may be partially exposed.

The second pad layer 130 may be removed by, e.g., a wet etching process.

An ion implantation process may be performed to form a light sensing element in the substrate 100, and the exposed portion of the first pad layer 120 may be removed. Thus, the first pad layer 120 may remain as a first pad 125, and an upper surface of the substrate 100 may be exposed.

Hereinafter, the fourth filling pattern 215, and upper portion of the first lateral pattern 175 on a sidewall of the fourth filling pattern 215, the first filling pattern 145 and the first and second pads 125 and 135 may be referred to as a first filling pattern structure 235. Additionally, the core including the second and third filling patterns 195 and 205 and the preliminary first lateral pattern structure including a lower portion of the first lateral pattern 175 and the preliminary second lateral pattern 185 may be referred to as a second filling pattern structure 225.

The preliminary second filling pattern structure 225 and the first filling pattern structure 235 stacked in the vertical direction may be referred to as a preliminary pixel division structure 250.

Figure 10:
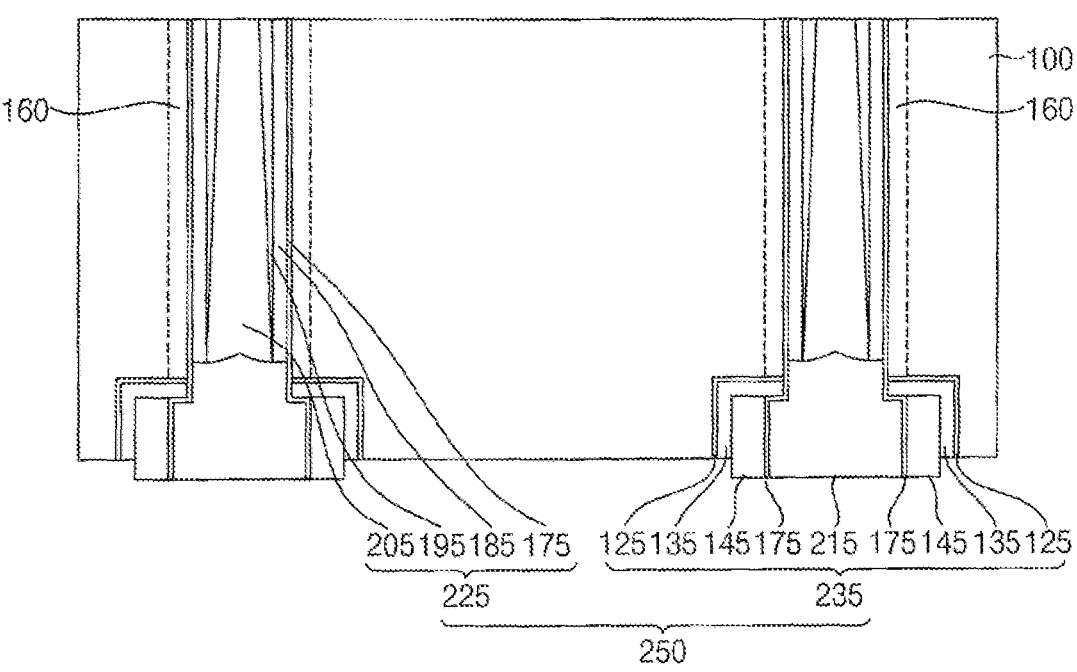

Referring to FIG. 10, the substrate 100 having the preliminary pixel division structure 250 therein may be overturned, and hereinafter, upper and lower portions of the structures in the substrate 100 may be referred to as lower and upper portions, respectively, of the structures.

An upper portion of the substrate 100 may be removed. In example embodiments, the upper portion of the substrate 100 may be removed by, e.g., a grinding process and/or a planarization process such as a CMP process. Thus, an upper portion of the preliminary second filling pattern structure 225 included in the pixel division structure 250 may be removed.

That is, upper portions of the core and the preliminary first lateral pattern structure included in the preliminary second filling pattern structure 225 may be removed, and upper surfaces of the first lateral pattern 175 and the preliminary second lateral pattern 185 included in the preliminary first lateral pattern structure may be exposed. Thus, the preliminary pixel division structure 250 may extend through the substrate 100.

Figure 11:
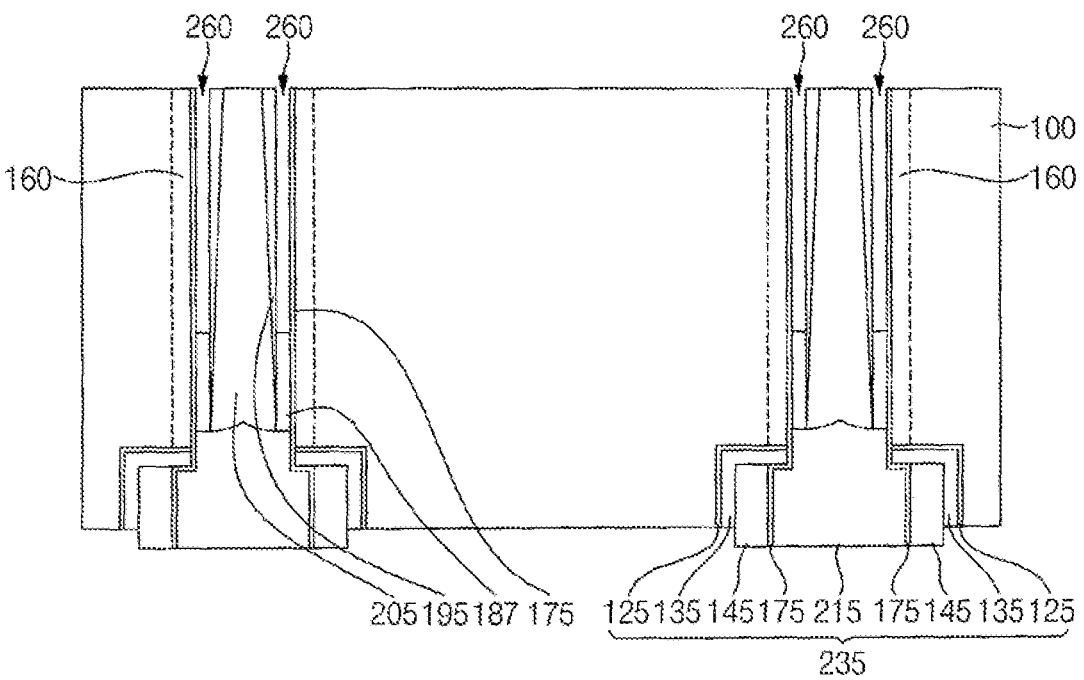

Referring to FIG. 11, the exposed preliminary second lateral pattern 185 shown in FIG. 10 may be partially removed to form a recess 260.

In example embodiments, the recess 260 may be removed by a wet etching process using, e.g., H$_3$PO$_4$ as an etching solution. After the wet etching process, a portion of the preliminary second lateral pattern 185 may remain as a second lateral pattern 187.

In example embodiments, the wet etching process for forming the recess 260 may be adjusted so as to control an amount of a portion of the preliminary second lateral pattern 185 that is etched by the wet etching process, and a height of the remaining second lateral pattern 187 may be controlled.

Referring to FIG. 1 again, a lower planarization layer 660 may be formed on the substrate 100.

The lower planarization layer 660 may include first to fifth layers 610, 620, 630, 640 and 650 sequentially stacked in the vertical direction. For example, the first to fifth layers 610, 620, 630, 640 and 650 may include aluminum oxide, hafnium oxide, silicon oxide, silicon nitride and hafnium oxide, respectively.

As the lower planarization layer 660 is formed, the recess 260 may remain as an air spacer 265 on the second lateral pattern 187, and a first lateral pattern structure including an upper portion of the first lateral pattern 175, the second lateral pattern 187 and the air spacer 265 may be formed.

The core and the first lateral pattern structure may form a second filling pattern structure 226, and the first and second filling pattern structures 235 and 226 may form a pixel division structure 252.

Figure 12:
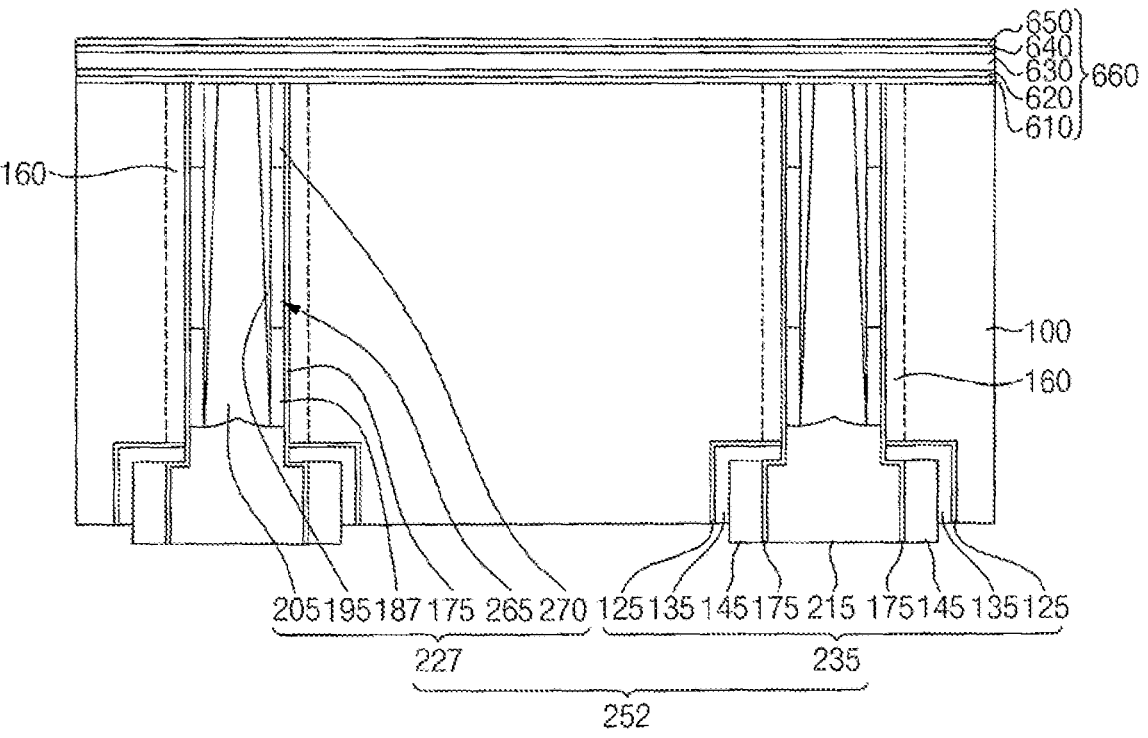
FIG. 12 is a cross-sectional view illustrating a pixel division structure according to an embodiment.

FIG. 12 is a cross-sectional view illustrating a pixel division structure in accordance with example embodiments. This pixel division structure may be substantially the same as or similar to that of FIG. 1, except for further including a third lateral pattern 270, and thus repeated explanations thereof are omitted herein.

Referring to FIG. 12, the pixel division structure 252 may include the first filling pattern structure 235 and a third filling pattern structure 227, and the third filling pattern structure 227 may include the core having the second and third filling patterns 195 and 205 and a second lateral pattern structure.

In example embodiments, the second lateral pattern structure may include the upper portion of the first lateral pattern 175, the second lateral pattern 187, the air spacer 265 and the third lateral pattern 270, and the second lateral pattern 187, the air spacer 265 and the third lateral pattern 270 may be sequentially stacked in the vertical direction.

In example embodiments, after the recess 260 is formed by the processes illustrated with reference to FIG. 11, when the lower planarization layer 660 is formed on the substrate 100 by the processes illustrated with reference to FIG. 1, a component of the first layer 610 included in the lower planarization layer 660 may flow into the recess 260 to form the third lateral pattern 270.

Thus, the third lateral pattern 270 may include a metal oxide, e.g., aluminum oxide, as the first layer 610. Aluminum oxide may have a refractive index lower than a refractive index of a nitride included in the second lateral pattern 187, and thus, when compared to a structure including only the preliminary second lateral pattern 185, the structure including the second lateral pattern 187, the air spacer 265 and the third lateral pattern 270 may increase the light efficiency of the pixel.

Figure 13:
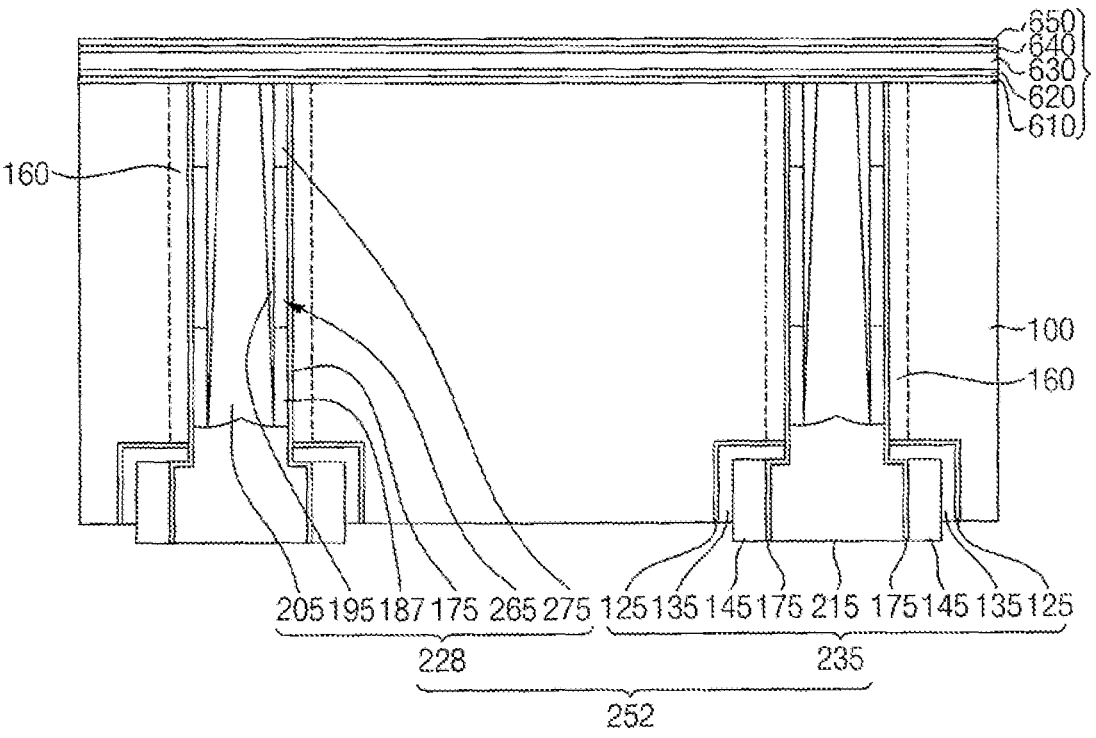
FIG. 13 is a cross-sectional view illustrating a pixel division structure according to an embodiment.

FIG. 13 is a cross-sectional view illustrating a pixel division structure in accordance with example embodiments. This pixel division structure may be substantially the same as or similar to that of FIG. 12, except for including a fourth lateral pattern 275 instead of the third lateral pattern 270, and thus repeated explanations thereof are omitted herein.

Referring to FIG. 13, the pixel division structure 252 may include the first filling pattern structure 235 and a fourth filling pattern structure 228, and the fourth filling pattern structure 228 may include the core having the second and third filling patterns 195 and 205 and a third lateral pattern structure.

In example embodiments, the third lateral pattern structure may include the upper portion of the first lateral pattern 175, the second lateral pattern 187, the air spacer 265 and the fourth lateral pattern 275. The second lateral pattern 187, the air spacer 265 and the fourth lateral pattern 275 may be sequentially stacked in the vertical direction.

The fourth lateral pattern 275 may include a material having a refractive index lower than a refractive index of a material included in the second lateral pattern 187. The second lateral pattern 187 may include a nitride, e.g., silicon nitride, silicon carbonitride, silicon oxycarbonitride, etc., and the fourth lateral pattern 275 may include a material having a refractive index lower than that of the nitride.

In example embodiments, after the recess 260 is formed by the processes illustrated with reference to FIG. 11, before the lower planarization layer 660 is formed on the substrate 100 by the processes illustrated with reference to FIG. 1, a material having a low refractive index may be deposited in an upper portion of the recess 260 to form the fourth lateral pattern 275.

Figure 14:
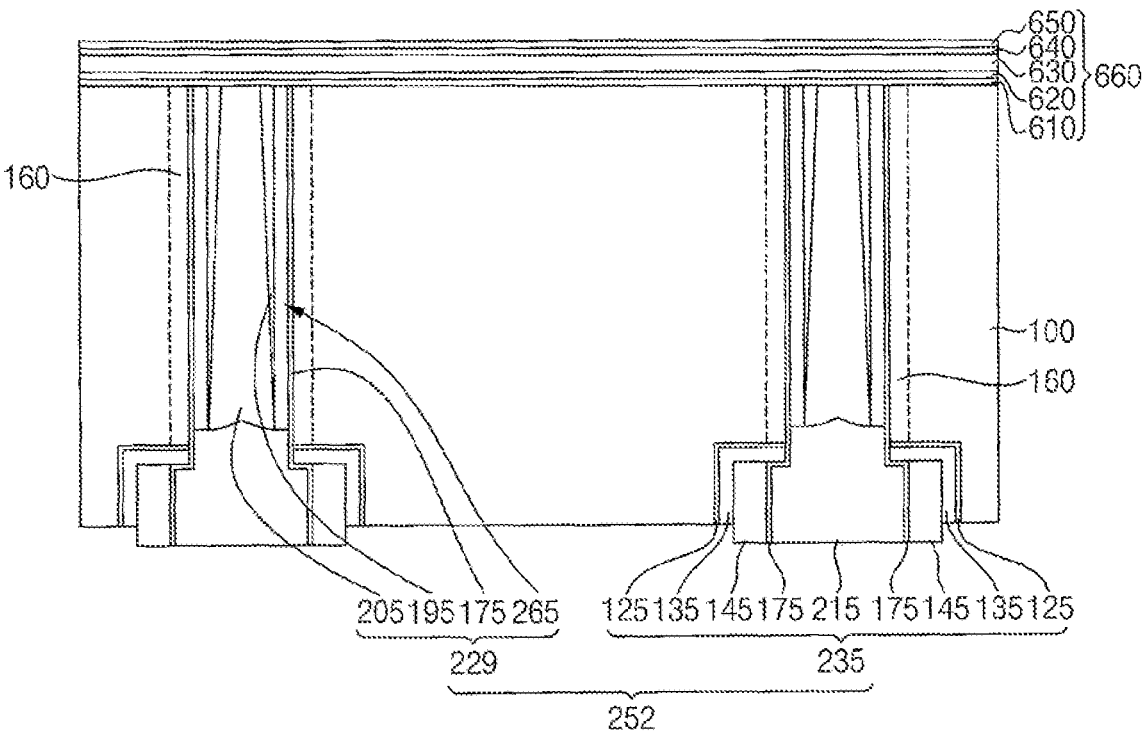
FIG. 14 is a cross-sectional view illustrating a pixel division structure according to an embodiment.

FIG. 14 is a cross-sectional view illustrating a pixel division structure in accordance with example embodiments. This pixel division structure may be substantially the same as or similar to that of FIG. 1, except that the pixel division structure of FIG. 14 does not include the second lateral pattern 187, and thus repeated explanations thereof are omitted herein.

Referring to FIG. 14, the pixel division structure 252 may include the first filling pattern structure 235 and a fifth filling pattern structure 229, and the fifth filling pattern structure 229 may include the core having the second and third filling patterns 195 and 205 and a fourth lateral pattern structure.

In example embodiments, the fourth lateral pattern structure may include the upper portion of the first lateral pattern 175 and the air spacer 265.

In example embodiments, when the recess 260 is formed by the processes illustrated with reference to FIG. 11, after removing the preliminary second lateral pattern 185, the lower planarization layer 660 may be formed on the substrate 100 by the processes illustrated with reference to FIG. 1, so that the recess 260 may be transformed into the air spacer 265.

In some embodiments, the fourth lateral pattern structure may further include the third lateral pattern 270 on the air spacer 265, and in this case, when the lower planarization layer 660 is formed after forming the recess 260, a component of the first layer 610 included in the lower planarization layer 660 may flow into the recess 260 to form the third lateral pattern 270. In an embodiment shown in FIG. 14, the second lateral pattern 187 and the third lateral pattern 270 are not formed.

Figure 15:
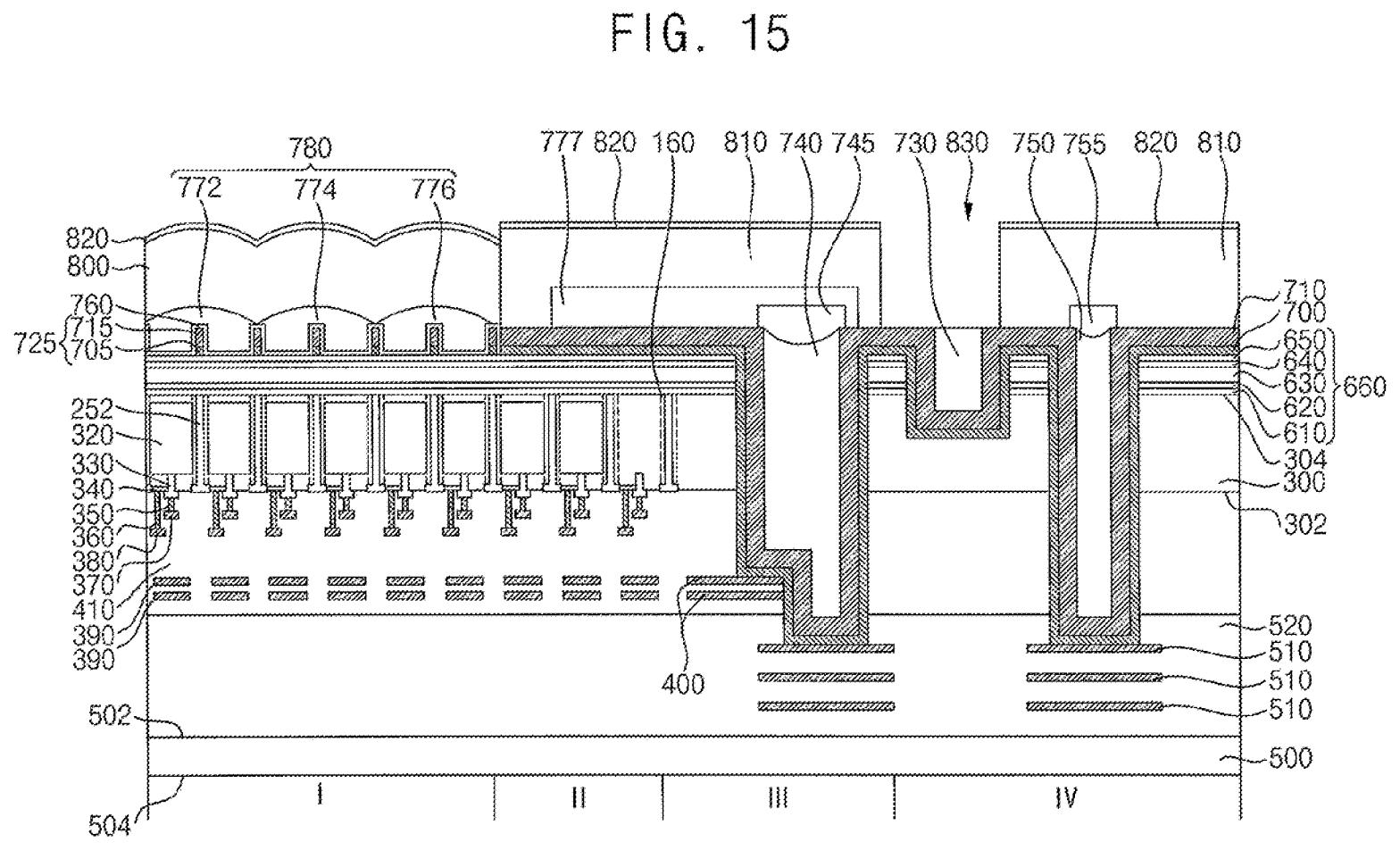

FIG. 15 is a cross-sectional view illustrating an image sensor in accordance with example embodiments.

This image sensor may include a pixel division structure substantially the same as or similar to the pixel division structure illustrated with reference to FIG. 1, and thus repeated explanations thereof are omitted herein.

This image sensor may also include pixel division structures substantially the same as or similar to the pixel division structures illustrated with reference to FIGS. 12 to 14.

Referring to FIG. 15, the image sensor may include a second substrate 500, a second insulating interlayer 520, a first insulating interlayer 410, a first substrate 300 and the lower planarization layer 660 sequentially stacked in the vertical direction in first to fourth regions I, II, III and IV. A color filter array layer 780, a microlens 800 and a transparent protection layer 820 may be sequentially stacked on the lower planarization layer 660 in the first region I, and a barrier pattern 700 and a conductive pattern 710 may be sequentially stacked on the lower planarization layer 660 in the second to fourth regions II, III, and IV. A light blocking color filter layer 777 may be formed on the conductive pattern 710, an upper planarization layer 810 may be formed on the conductive pattern 710 to cover the light blocking color filter layer 777, and the transparent protection layer 820 may be formed on the upper planarization layer 810. The upper planarization layer 810 and the transparent protection layer 820 may be sequentially stacked on the lower planarization layer 660 in the fourth region IV.

The image sensor may further include: first to third wirings 370, 380 and 390 and first and second vias 350 and 360 contained in the first insulating interlayer 410; the pixel division structure 252 extending through the first substrate 300 in the vertical direction; a light sensing element 320 in each unit pixel region defined by the pixel division structure 252; a transfer gate (TG) 330 extending through a lower portion of the first substrate 300 and having a lower portion protruding from a first surface 302 of the first substrate 300 and covered by the first insulating interlayer 410; and a floating diffusion (FD) region 340 at a lower portion of the first substrate 300 adjacent to the TG 330 in the first and second regions I and II.

The image sensor may further include an interference blocking structure 725 between color filters 772, 774, and 776 included in the color filter array layer 780 and a protection layer 760 covering a surface of the interference blocking structure 725 on the lower planarization layer 660 in the first region I.

The image sensor may further include a fourth wiring 400 contained in the first insulating interlayer 410, a fifth wiring 510 contained in the second insulating interlayer 520, and a first through via structure extending through the lower planarization layer 660, the first substrate 300, the first insulating interlayer 410 and an upper portion of the second insulating interlayer 520 to commonly contact the fourth and fifth wirings 400 and 510 in the third region III.

The image sensor may further include the fifth wiring 510 contained in the second insulating interlayer 520, a conductive pad 730 extending through the lower planarization layer 660 and an upper portion of the first substrate 300, and a second through via structure extending through the lower planarization layer 660, the first substrate 300, the first insulating interlayer 410 and an upper portion of the second insulating interlayer 520 to contact the fifth wiring 510.

The image sensor may further include various transistors at lower portions of the first substrate 300 adjacent to the first surface 302 of the first substrate 300. The transistors may include, e.g., source follower transistors, reset transistors and select transistors. The TG 330 and the FD region 340 may form a transfer transistor. That is, the light sensing element 320 may serve as a source region of the transfer transistor, and the FD region 340 may serve as a drain region of the transfer transistor.

Figure 24:
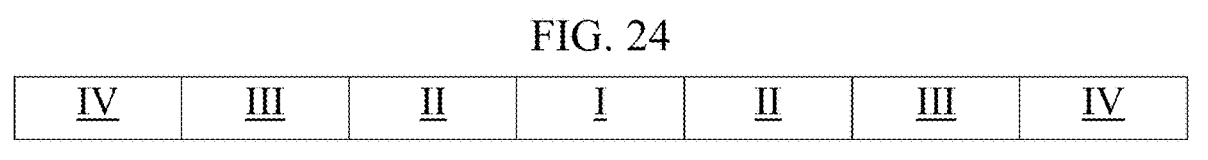

In example embodiments, in a plan view, the first region I may have a shape of a square or rectangle, the second region II may surround the first region I, the third region III may surround the second region II, and the fourth region IV may surround the third region III, however, the disclosure may not be limited thereto. An example of relationships of the first region I, the second region II, the third region III, and the fourth region IV is shown FIG. 24.

In example embodiments, the first region I may be an active pixel region in which active pixels are formed, the second region II may be an OB pixel region in which OB pixels are formed, the third region III may be a stack region in which the first through via structure is formed, and the fourth region IV may be a pad region in which the conductive pads 730 are formed.

The first substrate 300 may include the first surface 302 and a second surface 304 opposite to the first surface 302, and the second substrate 500 may include a third surface 502 and a fourth surface 504 opposite to the third surface 502. FIG. 15 shows that the first surface 302 is disposed under the second surface 304, and the third surface 502 is disposed over the fourth surface 504.

In example embodiments, p-type impurities may be doped into a portion or an entire portion of the first substrate 300 to form a p-type well.

The pixel division structure 252 may extend in the vertical direction in the first and second regions I and II of the first substrate 300, and may have a lattice pattern in a plan view. A plurality of unit pixel regions defined by the pixel division structure 252 may be arranged in the horizontal direction. The pixel division structure 252 may be substantially the same as or similar to that of FIG. 1. Alternatively, the pixel division structure 252 may be substantially the same as or similar to those of FIGS. 12 to 14.

In example embodiments, the light sensing element 320 may be a portion of a photodiode (PD). The light sensing element 320 may be an impurity region doped with n-type impurities in the p-well in the first and second regions I and II of the first substrate 300, and thus the light sensing element 320 and the p-well may form a PN junction diode.

The light sensing element 320 may be formed in each of the unit pixel regions defined by the pixel division structure 252 in the first and second regions I and II. However, the light sensing element 320 may not be formed in some of the unit pixel regions in the second region II.

The TG 330 may include a buried portion extending from the first surface 302 of the first substrate 300 in the vertical direction upwardly and a protrusion portion under the buried portion and having a bottom surface lower than the first surface 302 of the first substrate 300.

The FD region 340 may be formed at a portion of the first substrate 300 adjacent to the first surface 302 and the TG 330, and may be doped with n-type impurities.

The first via 350 may contact the TG 330, and may be connected to the first wiring 370. The second via 360 may contact the FD region 340, and may be connected to the second wiring 380.

Vias and wirings that may be connected to the various transistors, that is, the source follower transistors, the reset transistor and the select transistors may be further formed in the first insulating interlayer 410 in the first and second regions I and II. FIG. 15 shows that the third and fourth wirings 390 and 400 are formed at two levels in the vertical direction, however, the disclosure may not be limited thereto.

Each of the first and second insulating interlayers 410 and 520 may include an oxide, e.g., silicon oxide or a low-k dielectric material.

The lower planarization layer 660 may be substantially the same as or similar to that of FIG. 1.

The interference blocking structure 725 may be formed on the lower planarization layer 660 to overlap the pixel division structure 252 in the vertical direction, and may have a lattice pattern in a plan view. In example embodiments, the interference blocking structure 725 may include first and second interference blocking patterns 705 and 715 stacked in the vertical direction. The first interference blocking pattern 705 may include a metal nitride, and the second interference blocking pattern 715 may include a metal. Alternatively, the second interference blocking pattern 715 may include low refractive index material (LRIM).

The protection layer 760 may include a metal oxide, e.g., aluminum oxide.

The color filter array layer 780 may be formed on the protection layer 760, and sidewalls and bottom surfaces of the first color filter 772, the second color filter 774 and the third color filter 776 included in the color filter array layer 780 may be covered by the protection layer 760. For example, the first color filter 772, the second color filter 774 and the third color filter 776 may be a green color filter G, a blue color filter B and a red color filter R, respectively.

In example embodiments, the light blocking color filter layer 777 may include the same composition as a second color filter 774, which may absorb a light having a relatively large wavelength among the first color filter 772, the second color filter 774, and the third color filter 776 included in the color filter array layer 780.

The light blocking color filter layer 777 may be formed on the lower planarization layer 660 and the first through via structure in the second and third regions II and III, and may be spaced apart by a given distance in the horizontal direction from the first region I.

The first through via structure may include a sixth filling pattern 740 extending in the vertical direction through the lower planarization layer 660, the first substrate 300, the first insulating interlayer 410 and an upper portion of the second insulating interlayer 520, a conductive pattern 710 covering a lower surface and a sidewall of the sixth filling pattern 740, a barrier pattern 700 covering a lower surface and a sidewall of the conductive pattern 710, and a first capping pattern 745 on an upper surface of the sixth filling pattern 740.

The second through via structure may include a seventh filling pattern 750 extending in the vertical direction through the lower planarization layer 660, the first substrate 300, the first insulating interlayer 410 and an upper portion of the second insulating interlayer 520, the conductive pattern 710 covering a lower surface and a sidewall of the seventh filling pattern 750, the barrier pattern 700 covering the lower surface and the sidewall of the conductive pattern 710, and a second capping pattern 755 on an upper surface of the seventh filling pattern 750.

Each of the sixth and seventh filling patterns 740 and 750 may include, e.g., a LRIM, and each of the first and second capping patterns 745 and 755 may include, e.g., a photoresist material.

A portion of the conductive pattern 710 included in the first through via structure may commonly contact the fourth and fifth wirings 400 and 510 so that the fourth and fifth wirings 400 and 510 may be electrically connected with each other, and a portion of the conductive pattern 710 included in the second through via structure may contact the fifth wiring 510 so as to be electrically connected thereto.

The conductive pattern 710 may be included in the first and second through via structures, and may also be formed on the lower planarization layer 660 in the second to fourth regions II, III and IV. A portion of the conductive pattern 710 in the second and third regions II and III may be referred to as a light blocking metal pattern.

The conductive pattern 710 may include a metal, e.g., tungsten, and the barrier pattern 700 may include a metal nitride, e.g., titanium nitride.

The conductive pad 730 may be electrically connected with an outer wiring, and may be a path through which electrical signals may be input into the active pixels and/or the OB pixels, or electrical signals may be output from the active pixels and/or the OB pixels. The conductive pad 730 may include a metal, e.g., aluminum. A lower surface and a sidewall of the conductive pad 730 may be covered by the conductive pattern 710.

The microlens 800 may be formed on the color filter array layer 780 and the protection layer 760 in the first region I, and the upper planarization layer 810 may be formed on the light blocking color filter layer 777 and the second through via structure in the second to fourth regions II, III and IV, however, the upper planarization layer 810 may include a third opening 830 exposing an upper surface of the conductive pad 730 in the fourth region IV. In example embodiments, the microlens 800 and the upper planarization layer 810 may include the same or substantially the same material, e.g., a photoresist material having a high transmittance.

The transparent protection layer 820 may be formed on the microlens 800 and the upper planarization layer 810. The transparent protection layer 820 may include, e.g., SiO, SiOC, SiC, SiCN, etc.

The image sensor may include the pixel division structure 252 illustrated with reference to FIG. 1 or FIGS. 12 to 14, in which the first lateral pattern structure surrounding the core may include the air spacer 265 including air having a low refractive index in addition to the second lateral pattern 187 including a nitride having a high refractive index. Thus, the light efficiency of the pixel included in the image sensor may be enhanced.

Figure 16:
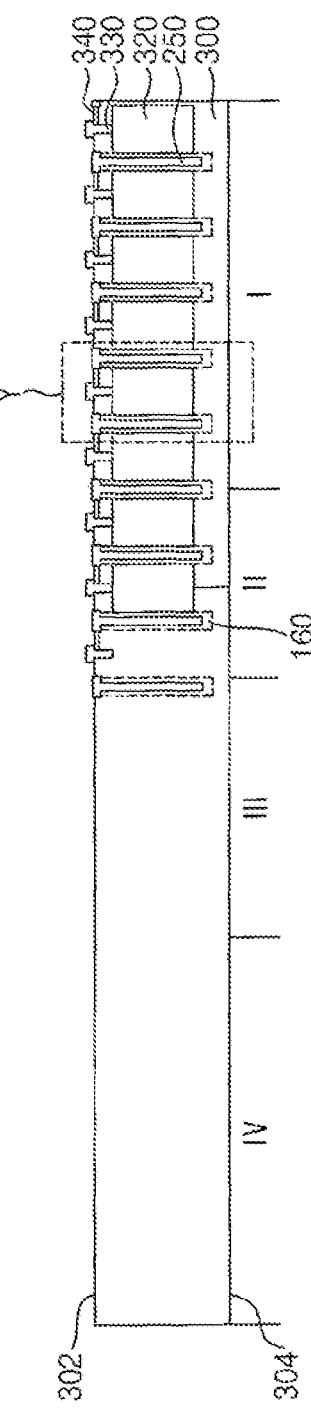
FIGS. 16 to 23 are cross-sectional views illustrating a method of manufacturing an image sensor according to an embodiment.
Figure 17:
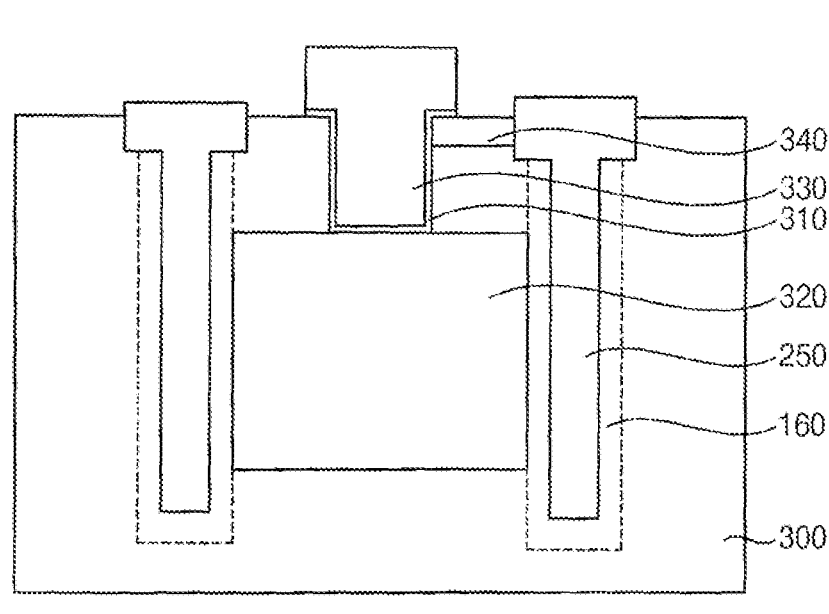

FIGS. 16 to 23 are cross-sectional views illustrating a method of manufacturing an image sensor in accordance with example embodiments. FIG. 17 is an enlarged cross-sectional view of region Y of FIG. 16. This method may include processes substantially the same as or similar to processes for forming the pixel division structure illustrated with reference to FIGS. 1 to 11, and thus repeated explanations thereof are omitted herein.

Referring to FIG. 16, the preliminary pixel division structure 250, the impurity region 160 and a light sensing element 320 may be formed in a first substrate 300 including first to fourth regions I, II, III and IV, and a TG 330 and a FD region 340 may be formed.

In example embodiments, p-type impurities, e.g., boron may be doped into a portion or an entire portion of the first substrate 300 to form a p-well.

The preliminary pixel division structure 250 and the impurity region 160 may be formed by processes substantially the same as or similar to those illustrated with reference to FIGS. 1 to 9. Thus, the preliminary pixel division structure 250 may be formed to extend from the first surface 302 in the vertical direction downwardly in the first and second regions I and II of the first substrate 300, and the impurity region 160 including p-type impurities, e.g., boron may be formed at a portion of the first substrate 300 adjacent to the preliminary pixel division structure 250. An impurity concentration of the impurity region 160 may be higher than an impurity concentration of the p-well.

In example embodiments, the light sensing element 320 may be a portion of a PD. Thus, the light sensing element 320 may be formed by doping n-type impurities, e.g., phosphorus into the p-well in the first and second regions I and II of the first substrate 300.

In some embodiments, the preliminary pixel division structure 250 may be formed after forming the light sensing element 320.

The TG 330 may be formed by forming a third trench extending in the vertical direction from the first surface 302 of the first substrate 300 downwardly, and filling the third trench and protruding from the trench upwardly using a conductive material.

The FD region 340 may be formed by doping n-type impurities, e.g., boron into a portion of the first substrate 300 adjacent to the first surface 302 and the TG 330.

Figure 18:
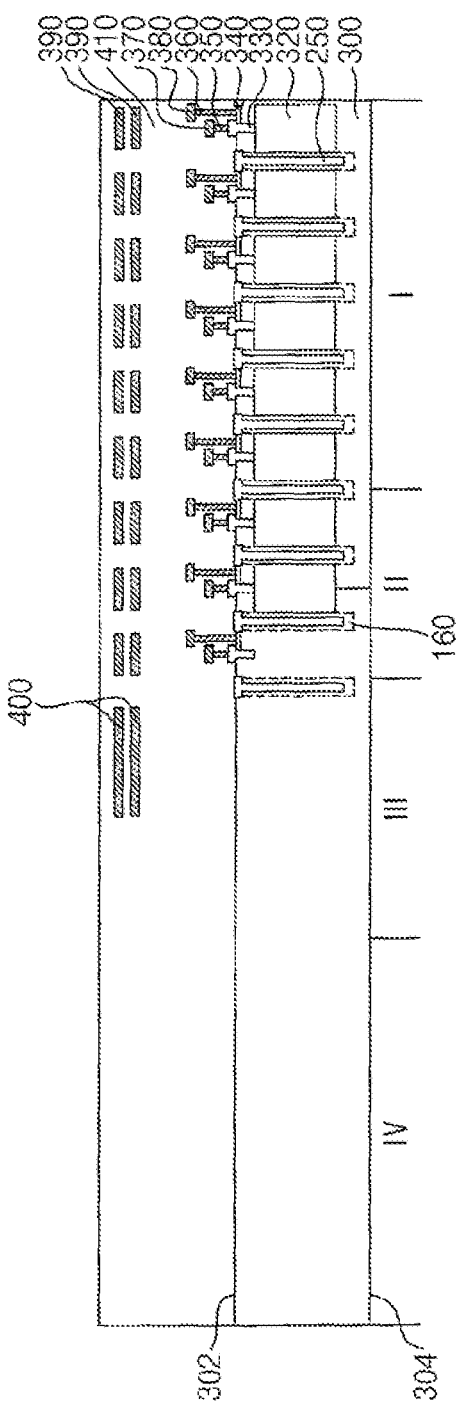

Referring to FIG. 18, a first insulating interlayer 410 containing first and second vias 350 and 360 and first to fourth wirings 370, 380, 390 and 400 may be formed on the first surface 302 of the first substrate 300.

In example embodiments, the first and second vias 350 and 360 and the first to fourth wirings 370, 380, 390 and 400 may be formed by a dual damascene process or a single damascene process.

Figure 19:
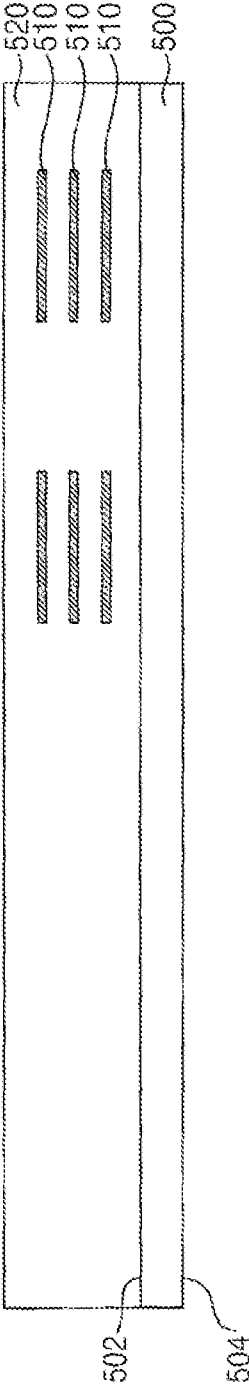

Referring to FIG. 19, a second insulating interlayer 520 containing a fifth wiring 510 and third vias connected to the fifth wiring 510 may be formed on a third surface 502 of a second substrate 500 including the third surface 502 and a fourth surface 504.

FIG. 19 shows the fifth wiring 510 is formed at third levels in the vertical direction, however, the disclosure may not be limited thereto. In example embodiments, the fifth wirings 510 and the third vias may be formed by a dual damascene process or a single damascene process.

Figure 20:
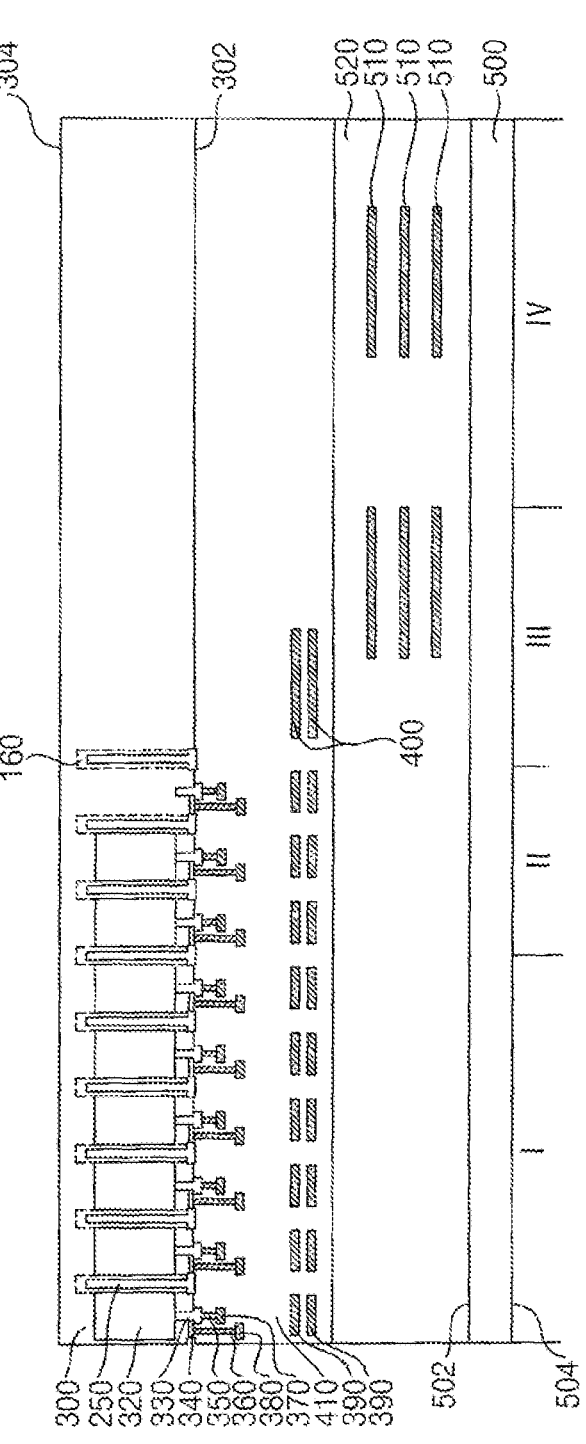

Referring to FIG. 20, the first insulating interlayer 410 on the first substrate 300 and the second insulating interlayer 520 on the second substrate 500 may be bonded with each other.

In example embodiments, the first and second insulating interlayers 410 and 520 may be bonded with each other through a bonding layer. Alternatively, the first and second insulating interlayers 410 and 520 may be directly bonded with each other. After bonding the first and second insulating interlayers 410 and 520, the bonded structure may be overturned so that the second surface 304 of the first substrate 300 may face upwardly as shown, e.g., in FIG. 20.

As the first and second substrates 300 and 500 are bonded with each other, the fifth wirings 510 on the second substrate 500 may be disposed in the third and fourth regions III and IV.

Figure 21:
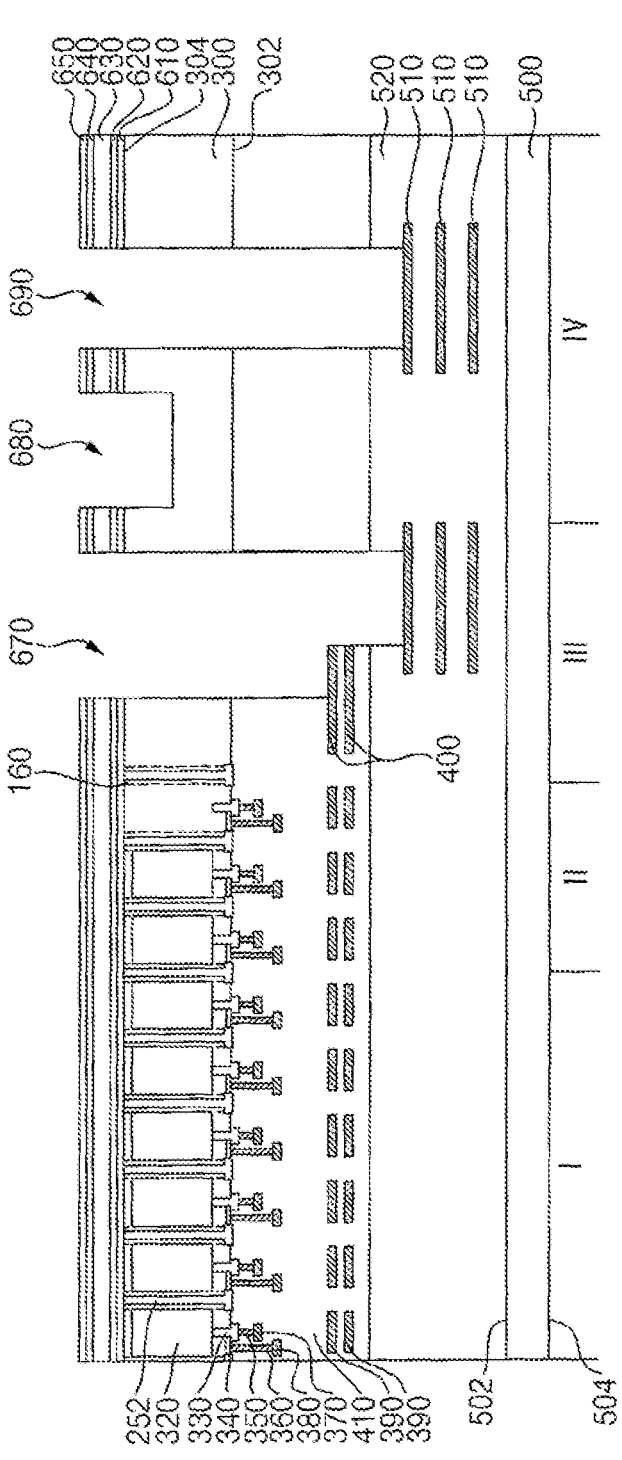

Referring to FIG. 21, a portion of the first substrate 300 adjacent to the second surface 304 may be removed.

In example embodiments, the portion of the first substrate 300 adjacent to the second surface 304 may be removed by a polishing process, e.g., a grinding process, a CMP process, etc. Thus, the preliminary second filling pattern structure 225 included in the preliminary pixel division structure 250 may be partially removed, and the preliminary pixel division structure 250 may extend through the first substrate 300.

That is, upper portions of the core and the preliminary first lateral pattern structure included in the preliminary second filling pattern structure 225 may be removed, and upper surfaces of the first lateral pattern 175 and the preliminary second lateral pattern 185 included in the preliminary first lateral pattern structure may be exposed.

Processes substantially the same as or similar to those illustrated with reference to FIG. 11 may be performed to form the recess 260 (refer to FIG. 11), and thus the preliminary second lateral pattern 185 may remain as the second lateral pattern 187.

A lower planarization layer 660 may be formed on the second surface 304 of the first substrate 300, and the recess 260 may be transformed into the air spacer 265. Thus, the first lateral pattern structure including the upper portion of the first lateral pattern 175, the second lateral pattern 187 and the air spacer 265 may be formed, and the core and the first lateral pattern structure may form the second filling pattern structure 226. The first and second filling pattern structures 235 and 226 may form a pixel division structure 252.

In an example embodiment, the lower planarization layer 660 may include first to fifth layers 610, 620, 630, 640 and 650 sequentially stacked in the vertical direction.

Referring to FIG. 21, the lower planarization layer 660, the first substrate 300, the first insulating interlayer 410 and an upper portion of the second insulating interlayer 520 in the third region III may be partially removed to form a first opening 670, the lower planarization layer 660 and an upper portion of the first substrate 300 in the fourth region IV may be removed to form a fourth trench 680, and the lower planarization layer 660, the first insulating interlayer 410 and an upper portion of the second insulating interlayer 520 in the fourth region IV may be removed to form a second opening 690.

The first opening 670 may expose the fourth wiring 400 in the first insulating interlayer 410 and the fifth wiring 510 in the second insulating interlayer 520, and the second opening 690 may expose the fifth wiring 510 in the second insulating interlayer 520.

Figure 22:
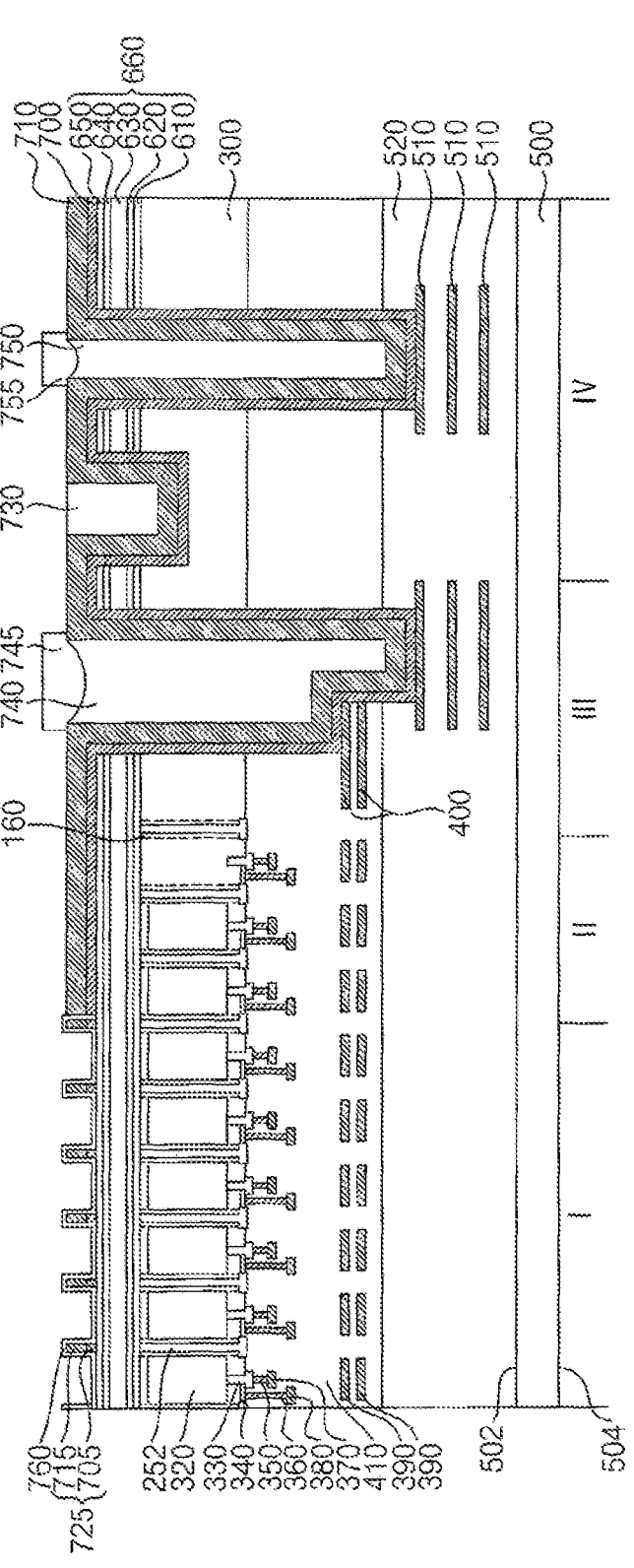

Referring to FIG. 22, a barrier layer and a first conductive layer may be sequentially formed on bottoms and sides of the first and second openings 670 and 690 and the fourth trench 680 and an upper surface of the lower planarization layer 660, a second conductive layer may be formed on the first conductive layer to fill the fourth trench 680, and an upper portion of the second conductive layer may be exposed until an upper surface of the first conductive layer is exposed.

Thus, a conductive pad 730 may be formed on the first conductive layer in the sixth trench 680 in the fourth region IV.

The planarization process may be performed by, e.g., a chemical mechanical polishing (CMP) process and/or an etch back process.

A sixth filling layer may be formed on the first conductive layer and the conductive pad 730 to fill the first and second openings 670 and 690, and an upper portion of the sixth filling layer may be planarized until an upper surface of the first conductive layer is exposed.

An additional etching process may be performed on the sixth filling layer so that a sixth filling pattern 740 may be formed on the first conductive layer in the first opening 670 in the third region III, and a seventh filling pattern 750 may be formed on the first conductive layer in the second opening 690 in the fourth region IV.

A capping layer may be formed on the sixth and seventh filling patterns 740 and 750 and the conductive pad 730, and patterned to form first and second capping patterns 745 and 755 on the sixth and seventh filling patterns 740 and 750, respectively.

Portions of the barrier layer and the first conductive layer in the first region I may be patterned to form first interference blocking pattern 705 and a second interference blocking pattern 715, respectively, and portions of the barrier layer and the first conductive layer in the second region II may remain as a barrier pattern 700 and a conductive pattern 710, respectively. The first and second interference blocking patterns 705 and 715 may form an interference blocking structure 725.

An upper surface of the lower planarization layer 660 in the first region I may be partially exposed.

Portions of the barrier pattern 700, the conductive pattern 710, the sixth filling pattern 740 and the first capping pattern 745 in the first opening 670 in the third region III may form a first through via structure, and portions of the barrier pattern 700, the conductive pattern 710, the seventh filling pattern 750 and the second capping pattern 755 in the second opening 690 in the fourth region IV may form a second through via structure.

A protection layer 760 may be formed on the lower planarization layer 660 and the interference blocking structure 725 in the first region I.

Figure 23:
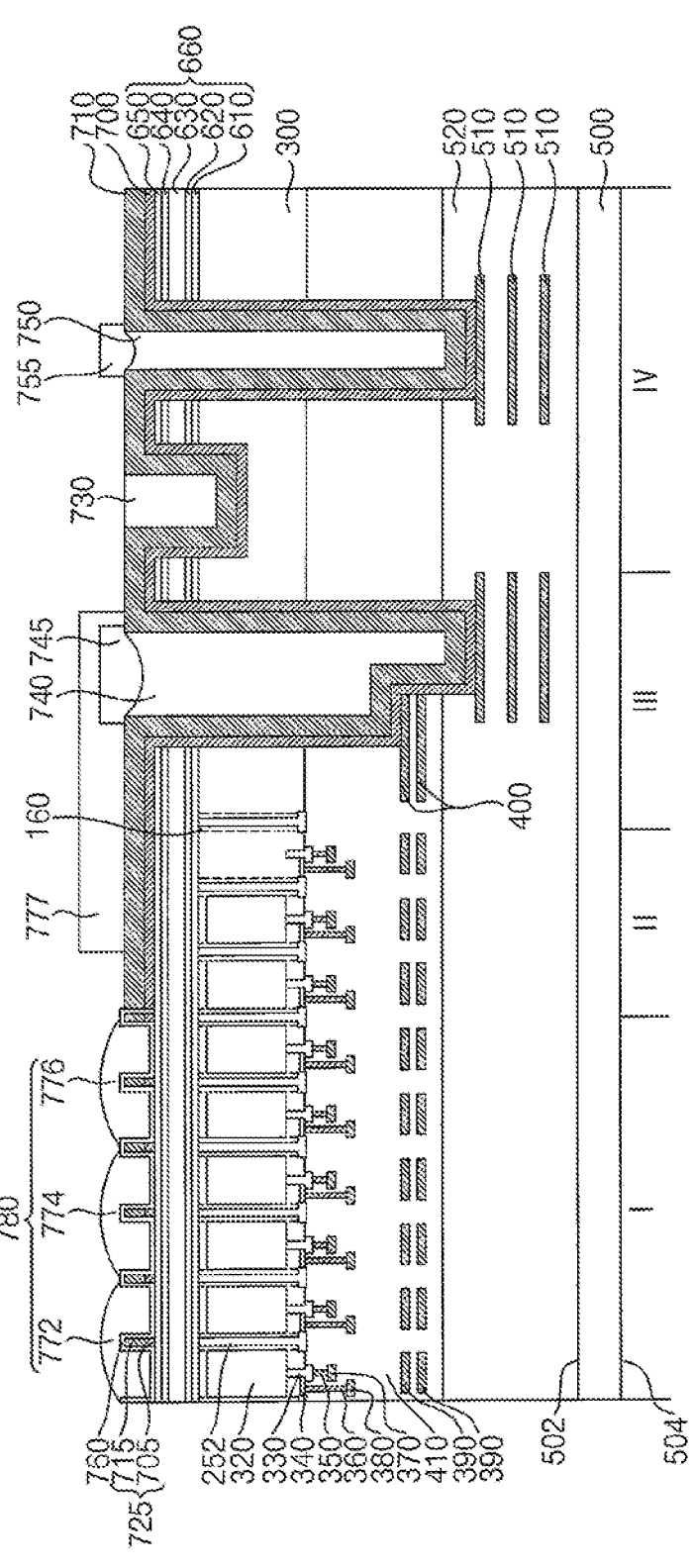

Referring to FIG. 23, a color filter array layer 780 including a first color filter 772, a second color filter 774 and a third color filter 776 may be formed on the protection layer 760 in the first region I, and a light blocking color filter layer 777 may be formed on the conductive pattern 710 and the first through via structure in the second and third regions II and III.

In example embodiments, each of the first color filter 772, the second color filter 774 and the third color filter 776 may be formed by depositing a color filter layer on the protection layer 760, the conductive pattern 710, the first and second capping patterns 745 and 755 and the conductive pad 730, e.g., through a spin coating process, and performing an exposure process and a developing process on the color filter layer.

The light blocking color filter layer 777 may be formed together with some of the color filters included in the color filter array layer 780, e.g., the second color filter 774.

In example embodiments, the first color filter 772, the second color filter 774 and the third color filter 776 may be a green filter G, a blue filter B and a red filter R, respectively. However, the disclosure may not be limited thereto.

Referring to FIG. 15 again, an upper planarization layer 810 may be formed on the color filter array layer 780, the protection layer 760, the light blocking color filter layer 777, the conductive pad 730 and the second capping pattern 755 in the first to fourth regions I, II, III and IV, and a patterning process and a reflow process may be performed on the upper planarization layer 810 in the first region I to form a microlens 800.

A transparent protection layer 820 may be formed on the microlens 800 and the upper planarization layer 810, and a portion of the transparent protection layer 820 overlapping the conductive pad 730 in the vertical direction in the fourth region IV and a portion of the upper planarization layer 810 thereunder may be removed to form a third opening 830 exposing an upper surface of the conductive pad 730.

An upper wiring may be further formed to be electrically connected to the conductive pad 730 to complete the fabrication of the image sensor.

As described above, although example embodiments have been described, those skilled in the art will readily appreciate that many modifications are possible in the example embodiments without materially departing from the novel teachings and advantages of the disclosure. Each of the embodiments provided above is not excluded from being associated with one or more features of another example or another embodiment also provided herein or not provided herein but consistent with the inventive concept. For example, even if matters described in a pixel division structure in an embodiment are not described in a pixel division structure in another embodiment, the matters may be understood as being related to or combinable with the pixel division structure in the other embodiment, unless otherwise mentioned in descriptions thereof. In addition, it should be understood that all descriptions of principles, aspects, examples, and specific embodiments are intended to encompass structural and functional equivalents thereof. In addition, these equivalents should be understood as including not only currently well-known equivalents but also equivalents to be developed in the future, that is, all devices invented to perform the same functions regardless of the structures thereof

What is claimed is:

1. An image sensor comprising:
   a pixel division structure extending through a substrate in a vertical direction, the vertical direction being substantially perpendicular to an upper surface of the substrate, the pixel division structure defining unit pixel regions in which unit pixels are respectively formed;
   a light sensing element in each of the unit pixel regions;
   a planarization layer on the substrate;
   a color filter array layer on the planarization layer, the color filter array layer comprising color filters; and
   a microlens on the color filter array layer,
   wherein the pixel division structure comprises:
      a core extending in the vertical direction; and
      a lateral pattern structure on an outer sidewall of the core, and
   wherein the lateral pattern structure comprises:
      a first lateral pattern on an outer sidewall of a lower portion of the core;
      an air spacer on the outer sidewall of the core, and on the first lateral pattern in the vertical direction; and
      a second lateral pattern on outer sidewalls of the first lateral pattern and on outer sidewalls of the air spacer.

2. The image sensor of claim 1, wherein the first lateral pattern comprises a nitride, and the second lateral pattern comprises an oxide.

3. The image sensor of claim 1, further comprising a third lateral pattern on the air spacer in the vertical direction.

4. The image sensor of claim 3, wherein the third lateral pattern comprises a material substantially the same as a material of the planarization layer.

5. The image sensor of claim 4, wherein the planarization layer comprises a first layer, a second layer, a third layer, a fourth layer, and a fifth layer sequentially stacked in the vertical direction, and
   wherein the third lateral pattern comprises a material substantially the same as a material of the first layer.

6. The image sensor of claim 5, wherein the third lateral pattern comprises a metal oxide.

7. The image sensor of claim 3, wherein the third lateral pattern comprises a material having a refractive index lower than a refractive index of a material included in the first lateral pattern.

8. The image sensor of claim 1, wherein the core comprises:
   a first filling pattern including polysilicon doped with p-type impurities or n-type impurities; and
   a second filling pattern in a space formed by the first filling pattern,
   wherein a sidewall of the second filling pattern is covered by the first filling pattern and the second filling pattern comprises polysilicon.

9. The image sensor of claim 1, wherein the core and the lateral pattern structure form a first filling pattern structure, and
   wherein the pixel division structure further comprises a second filling pattern structure under the first filling pattern structure.

10. The image sensor of claim 9, wherein a width of the second filling pattern structure is greater than a width of the first filling pattern structure.

11. An image sensor comprising:
a pixel division structure extending through a substrate in a vertical direction, the vertical direction being substantially perpendicular to an upper surface of the substrate, the pixel division structure defining unit pixel regions in which unit pixels are respectively formed;
a light sensing element in each of the unit pixel regions;
a planarization layer on the substrate;
a color filter array layer on the planarization layer, the color filter array layer comprises color filters; and
a microlens on the color filter array layer,
wherein the pixel division structure comprises:
    a core extending in the vertical direction and including polysilicon; and
    a lateral pattern structure on an outer sidewall of the core in a horizontal direction, the outer sidewall of the core facing away from a center, in the horizontal direction, of the core, and
wherein the lateral pattern structure comprises:
    an air spacer on the outer sidewall of the core; and
    a first lateral pattern on an outer sidewall of the air spacer, the first lateral pattern comprising an oxide.

12. The image sensor of claim 11, further comprising a second lateral pattern on the air spacer.

13. The image sensor of claim 12, wherein the second lateral pattern comprises a material substantially the same as a material of the planarization layer.

14. The image sensor of claim 13, wherein the planarization layer comprises a first layer, a second layer, a third layer, a fourth layer, and a fifth layer sequentially stacked in the vertical direction, and
    wherein the material of the second lateral pattern is substantially the same as a material of the first layer of the planarization layer.

15. The image sensor of claim 14, wherein the second lateral pattern comprises a metal oxide.

16. The image sensor of claim 11, wherein the core comprises:
    a first filling pattern comprising polysilicon doped with p-type impurities or n-type impurities; and
    a second filling pattern in a space formed by the first filling pattern,
    wherein a sidewall of the second filling pattern is covered by the first filling pattern and the second filling pattern comprises polysilicon.

17. The image sensor of claim 11, wherein the core and the lateral pattern structure form a first filling pattern structure, and
    wherein the pixel division structure further comprises a second filling pattern structure under the first filling pattern structure.

18. An image sensor comprising:
a first substrate defining a first region, a second region, a third region, and a fourth region at an inside of the first substrate and a space under and over the first substrate, the second region surrounding the first region, the third region surrounding the second region, and the fourth region surrounding the third region;

a first insulating interlayer on the first substrate, the first insulating interlayer containing first wirings in the third region;
a second insulating interlayer on the first insulating interlayer, the second insulating interlayer containing second wirings in the third region;
a second substrate on the second insulating interlayer;
a pixel division structure in the second substrate in the first region and the second region, the pixel division structure defining unit pixel regions in which unit pixels are formed, respectively;
a light sensing element in each of the unit pixel regions of the second substrate;
a transfer gate (TG) extending through a lower portion of the second substrate, the TG contacting the light sensing element;
a floating diffusion (FD) region at the lower portion of the second substrate adjacent to the TG;
a lower planarization layer on the second substrate;
a color filter array layer on the lower planarization layer, the color filter array layer comprising color filters;
an interference blocking structure between adjacent ones of the color filters; and
a microlens on the color filter array layer,
wherein the pixel division structure comprises:
    a core extending in a vertical direction, the vertical direction being substantially perpendicular to an upper surface of the first substrate; and
    a lateral pattern structure on an outer sidewall of the core, and
wherein the lateral pattern structure comprises:
    a first lateral pattern on an outer sidewall of a lower portion of the core;
    an air spacer on the outer sidewall of the core, and on the first lateral pattern in the vertical direction; and
    a second lateral pattern on outer sidewalls of the first lateral pattern and outer sidewalls of the air spacer.

19. The image sensor of claim 18, further comprising:
a light blocking metal pattern on the lower planarization layer in the second region;
a through via structure extending through the lower planarization layer, the second substrate, the second insulating interlayer and an upper portion of the first insulating interlayer in the third region, the through via structure commonly contacting the first wirings and the second wirings; and
a pad extending through the lower planarization layer and an upper portion of the second substrate in the fourth region.

20. The image sensor of claim 19, wherein the first region comprises an active pixel region in which active pixels are formed, the second region comprises an optical black (OB) pixel region in which OB pixels are formed, the third region comprises a stack region in which the through via structure is formed, and the fourth region comprises a pad region in which the pad is formed.

21. The image sensor of claim 1, wherein an upper surface of the first lateral pattern defines a bottom end of the air spacer.

* * * * *